United States Patent [19]
Vijeh et al.

[11] Patent Number: 5,430,762
[45] Date of Patent: * Jul. 4, 1995

[54] EXPANDABLE REPEATER

[75] Inventors: Nader Vijeh, Cupertino; David Staab, San Jose, both of Calif.

[73] Assignee: Advanced Micro Devices, Inc., Sunnyvale, Calif.

[*] Notice: The portion of the term of this patent subsequent to Nov. 23, 2010 has been disclaimed.

[21] Appl. No.: 102,361

[22] Filed: Aug. 5, 1993

Related U.S. Application Data

[63] Continuation of Ser. No. 556,046, Jul. 20, 1990, abandoned, which is a continuation-in-part of Ser. No. 480,426, Feb. 15, 1990, Pat. No. 5,164,960.

[51] Int. Cl.⁶ ..................... H04B 3/36; H04L 25/20; H04L 25/52
[52] U.S. Cl. .................................. 375/211; 370/85.3
[58] Field of Search ................... 375/3, 107; 370/85.1, 370/85.2, 26, 35, 85.3; 340/825.52

[56] References Cited

U.S. PATENT DOCUMENTS

| | | |
|---|---|---|
| 4,161,786 | 7/1979 | Hopkins et al. . |
| 4,413,258 | 11/1983 | Quick, Jr. et al. . |
| 4,451,827 | 5/1994 | Kahn et al. . |
| 4,701,756 | 10/1987 | Burr . |
| 4,712,210 | 12/1987 | Davis et al. . |
| 5,265,123 | 11/1993 | Vijeh et al. ............... 375/3 |

FOREIGN PATENT DOCUMENTS

| | | |
|---|---|---|
| 0222669 | 5/1987 | European Pat. Off. . |
| 0308890 | 3/1989 | European Pat. Off. . |

OTHER PUBLICATIONS

Joh, C. C., et al., "New Chips for Starlan-10 Networks", *AT&T Technology*, 4(1):32–35 (Apr. 4, 1989).

Primary Examiner—Stephen Chin
Assistant Examiner—Tesfaldet Bocure
Attorney, Agent, or Firm—Benman Collins & Sawyer

[57] ABSTRACT

A discrete repeater having a predetermined number of ports includes an expansion port permitting connection of one or more of similar devices to produce a single repeater unit having an increased number of ports. The expansion port includes two bidirectional channels, an output channel and two input channels. An arbiter function connects to each discrete repeater to assert appropriate signals to permit the discrete repeaters making up a repeater unit to exchange data and collision information. This exchange of data is used in a state machine of the discrete repeaters to provide a repeater unit with distributed repeater and relay functions.

13 Claims, 37 Drawing Sheets

| REQ | ACK | COL | DAT | JAM | STATE |
|---|---|---|---|---|---|
| 0 | 0 | 0 | 0 | 0 | IDLE |
| 0 | 0 | 0 | 0 | 1 | INVALID ⎫ UNTIL AN IMR CONTROLS BUS- JAM OR |
| 0 | 0 | 0 | 1 | 0 | INVALID ⎬ DAT MAY NOT BE ASSERTED |
| 0 | 0 | 0 | 1 | 1 | INVALID ⎭ |
| 0 | 0 | 1 | 0 | 0 | TWO OTHER IMRS REQ'D BUS; GENERATE JAM SEQ |
| 0 | 0 | 1 | 0 | 1 | INVALID ⎫ UNTIL AN IMR CONTROLS BUS- JAM OR |
| 0 | 0 | 1 | 1 | 0 | INVALID ⎬ DAT MAY NOT BE ASSERTED |
| 0 | 0 | 1 | 1 | 1 | INVALID ⎭ |
| 0 | 1 | 0 | 0 | 0 | DIFFERENT IMR REQ'D AND CONTROLS BUS; DATA ON DAT TO BE REPEATED |
| 0 | 1 | 0 | 0 | 1 | DIFFERENT IMR CONTROLS BUS AND EXPERIENCES A COLLISION, DATA ON DAT INDICATES COLLISION TYPE IS TRANSMISSION |
| 0 | 1 | 0 | 1 | 0 | DIFFERENT IMR REQ'D AND CONTROLS BUS; DATA ON DAT TO BE REPEATED |
| 0 | 1 | 0 | 1 | 1 | DIFFERENT IMR CONTROLS BUS AND EXPERIENCES A COLLISION, DATA ON DAT INDICATES COLLISION TYPE IS RECEIVE |
| 0 | 1 | 1 | 0 | 0 | INVALID ⎫ |
| 0 | 1 | 1 | 0 | 1 | INVALID ⎬ ACK AND COL ARE MUTUALLY EXCLUSIVE |
| 0 | 1 | 1 | 1 | 0 | INVALID ⎬ |
| 0 | 1 | 1 | 1 | 1 | INVALID ⎭ |
| 1 | 0 | 0 | 0 | 0 | IMR HAS DATA AT ONE OF ITS PORTS, REQUESTING CONTROL OF EXPANSION BUS |
| 1 | 0 | 0 | 0 | 1 | INVALID ⎫ DAT OR JAM MAY NOT BE ASSERTED |
| 1 | 0 | 0 | 1 | 0 | INVALID ⎬ UNTIL CONTROL OF BUS IS GRANTED |
| 1 | 0 | 0 | 1 | 1 | INVALID ⎭ |
| 1 | 0 | 1 | 0 | 0 | A SECOND IMR ALSO REQ'D; GENERATE JAM SEQ |
| 1 | 0 | 1 | 0 | 1 | INVALID ⎫ DAT OR JAM MAY NOT BE ASSERTED |
| 1 | 0 | 1 | 1 | 0 | INVALID ⎬ UNTIL AN IMR CONTROLS BUS |
| 1 | 0 | 1 | 1 | 1 | INVALID ⎭ |
| 1 | 1 | 0 | 0 | 0 | THIS IMR HAS CONTROL OF BUS; DATA PUT ON DAT WILL BE REPEATED BY OTHER IMRs |
| 1 | 1 | 0 | 0 | 1 | SINGLE IMR EXPERIENCING COLLISION; DAT INDICATES THAT COLLISION TYPE IS TRANSMISSION |
| 1 | 1 | 0 | 1 | 0 | VALID DATA DRIVEN ON DAT BY IMR; REPEATED BY OTHER IMR |
| 1 | 1 | 0 | 1 | 1 | SINGLE IMR EXPERIENCING A COLLISION; DAT INDICATES THAT COLLISION TYPE IS RECEIVE |
| 1 | 1 | 1 | 0 | 0 | INVALID ⎫ |
| 1 | 1 | 1 | 0 | 1 | INVALID ⎬ UNTIL AN IMR CONTROLS BUS - JAM |
| 1 | 1 | 1 | 1 | 0 | INVALID ⎬ OR DAT MAY NOT BE ASSERTED |
| 1 | 1 | 1 | 1 | 1 | INVALID ⎭ |

*FIG. 5.*

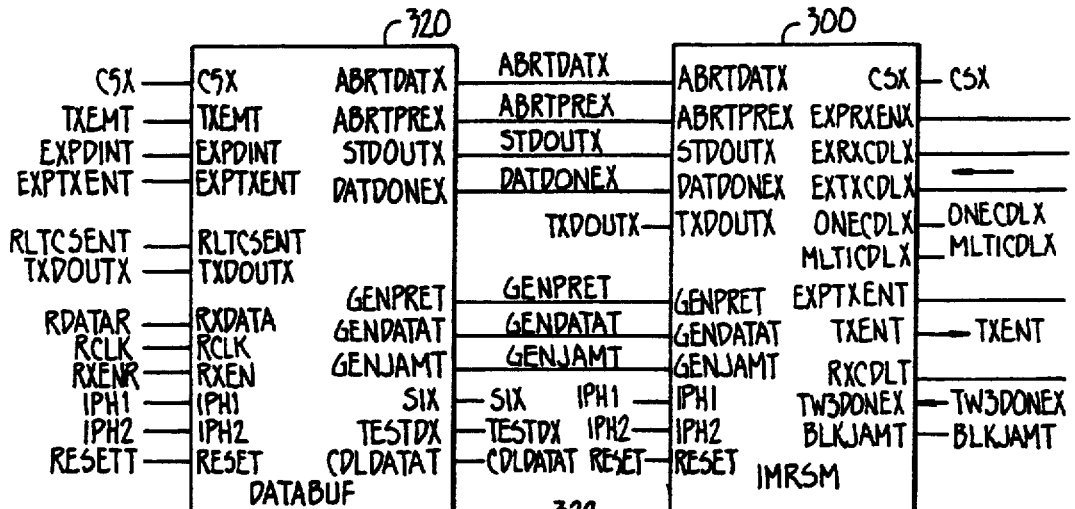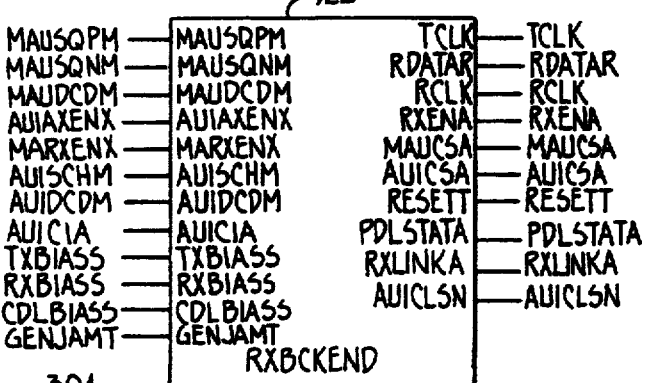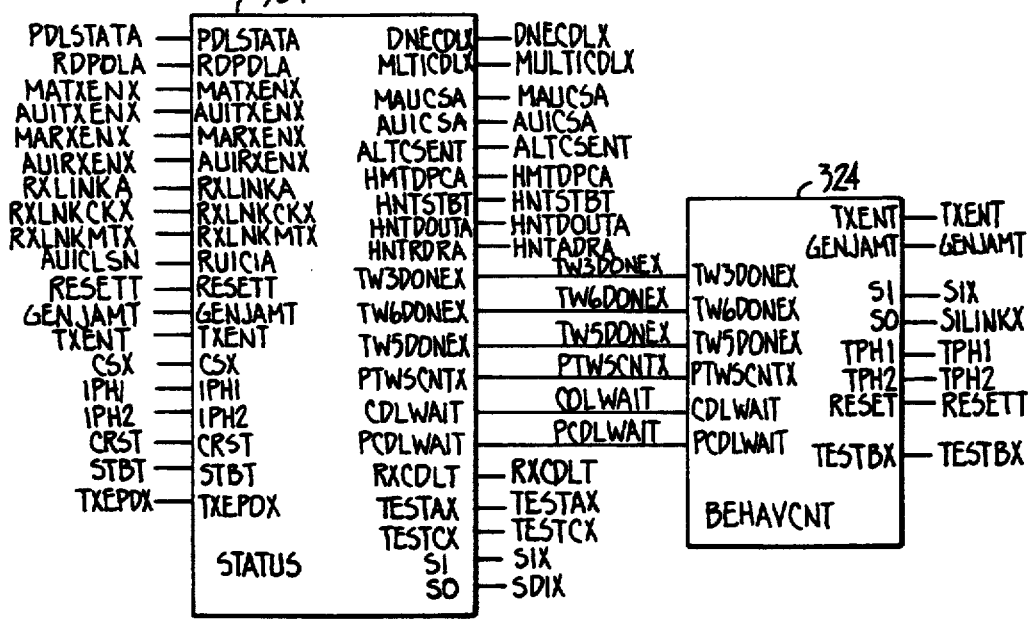
FIG. 7B.

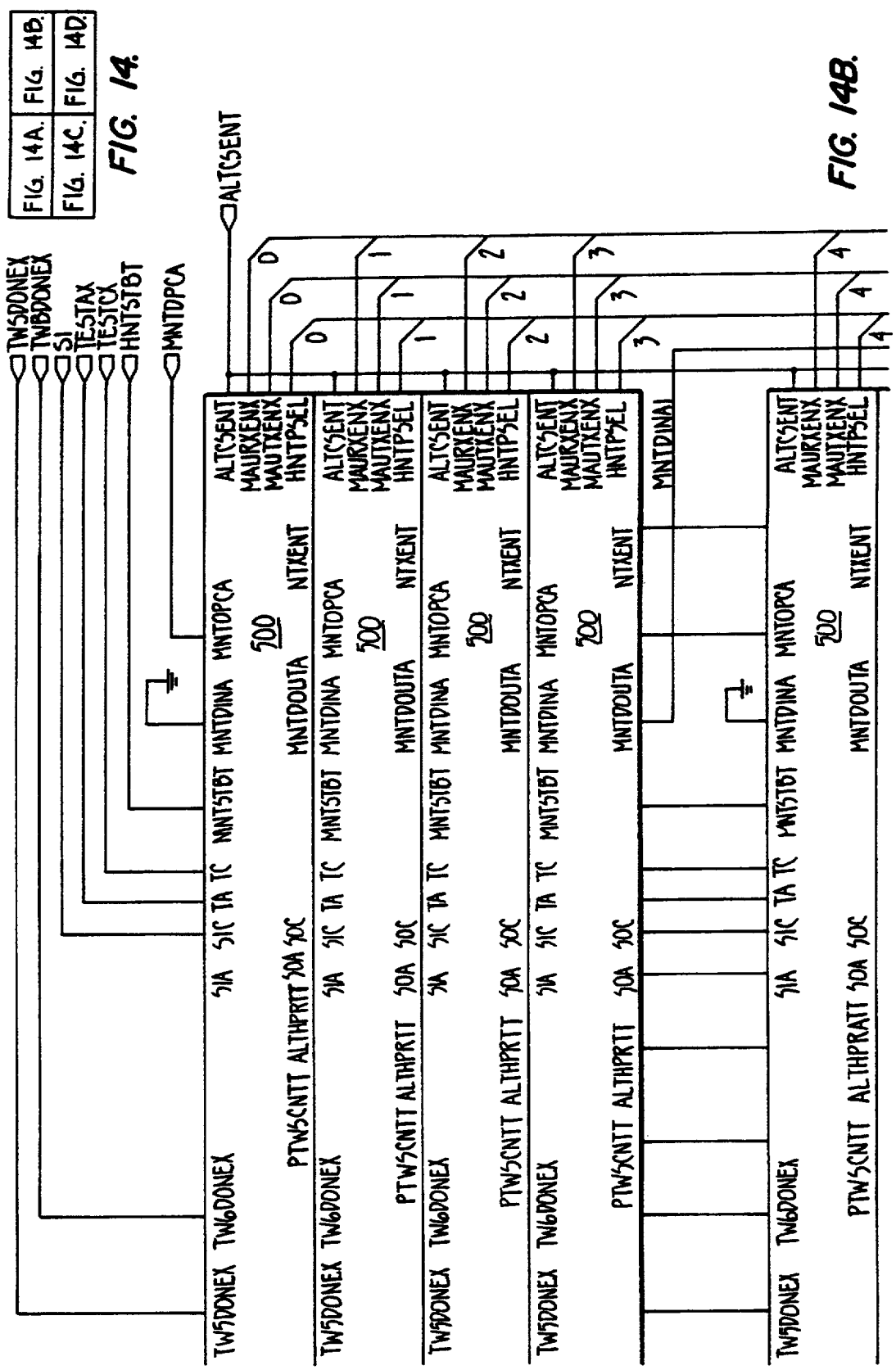

| FIG. 15A. | FIG. 15B. |

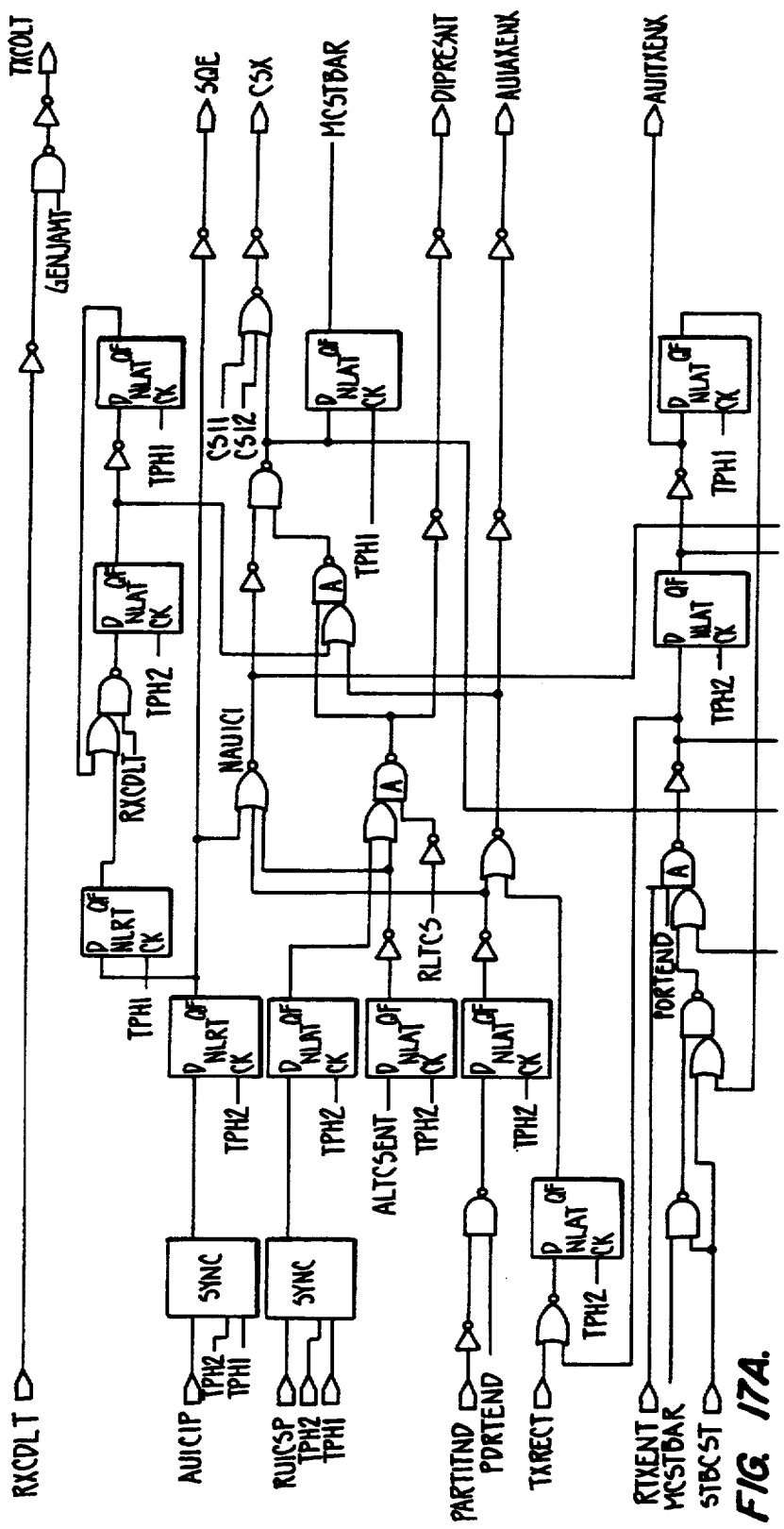

FIG. 22B₁.

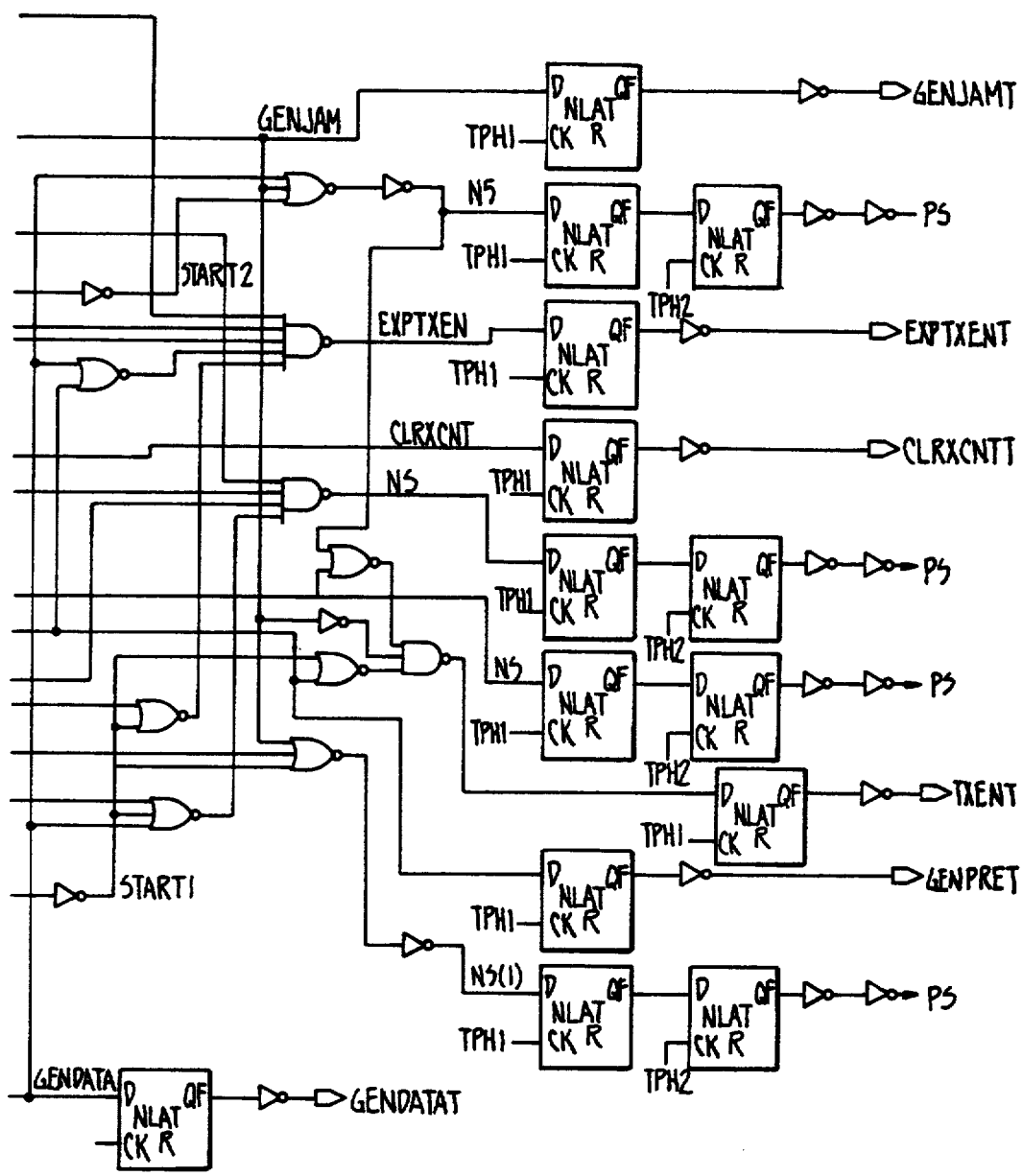
FIG. 22B₂.

EXPANDABLE REPEATER

CROSS-REFERENCE TO RELATED APPLICATIONS

This application is a continuation of application Ser. No. 07/556,046, filed Jul. 20, 1990, now abandoned which is a continuation-in-part application of MEDIUM ATTACHMENT UNIT FOR USE WITH TWISTED PAIR LOCAL AREA NETWORK, Ser. No. 07/480,426, issued filed Feb. 15, 1990, (now U.S. Pat. No. 5,164,960, issued Nov. 17, 1992), both hereby expressly incorporated by reference for all purposes.

BACKGROUND OF THE INVENTION

The present invention relates to repeaters used in computer networks. Specifically, the invention relates to integrating a plurality of twisted pair Medium Attachment Units ("MAU") with a repeater in monolithic silicon and providing port expansion capability.

Businesses use computer networks to improve productivity. Many different network types were developed to aid this productivity improvement. One such network type as a Carrier Sense, Multiple Access—Collision Detection ("CSMA/CD") network. IEEE 802.3 Standard, hereby expressly incorporated by reference for all purposes, specifies working characteristics for a CSMA/CD network. A commercial system known as ETHERNET ®, a registered trademark of Xerox Corporation, is an example of such a system.

CSMA/CD networks provide a plurality of nodes which have a controller to interface to the network. The nodes may be any type of data terminal equipment ("DTE") for transferring data to another DTE. The controller conditions incoming and outgoing data and control signals according to the particular network protocol. It is possible to use one or more medium types to carry the communication signals. This medium is often coaxial cable because of the cable's well known and predictable parameters. The different protocols available each requires structured data and control information. The controller prepares data and control information according to the specific protocol used. The data and control information become data and control signals. These signals are independent of the actual medium used. Translating these medium independent signals into signal types specific to the particular medium is the function of the MAU. An attachment unit interface ("AUI") couples the controller and the MAU. The IEEE 802.3 Standard defines the protocol between the AUI and the MAU as well as the AUI characteristics.

An obstacle to greater use of computer networks is installation costs. Retrofitting a building with necessary wiring to use a network can require relatively large costs for installing the network. Development of a network protocol which operates over preexisting telephone lines reduces the installation cost by removing some of the wiring expense. The preexisting telephone wiring typically uses twisted pair cable. Problems of the twisted pair cable directly relate to its lack of shielding making it vulnerable to noise. Using the twisted pair cable as a network medium complicates network installation because ambient noise interferes with network operation. There are also limitations on electromagnetic radiation emissions from an operating network. These limitations become more difficult to meet due to the lack of shielding for the wiring. Also, line characteristics of preinstalled wiring networks are unpredictable making impedance matching difficult, further complicating specifications for signal drivers and receivers.

A group of manufacturers jointly developed a 10BASE-T draft standard, hereby expressly incorporated by reference for all purposes. The draft standard enables network use of twisted pair wiring. The 10BASE-T draft standard outlines devices and device characteristics to carry out a CSMA/CD protocol through a twisted pair medium. This draft standard defines the MAU and its operation. Many networks realizing the IEEE 802.3 Standard use a medium (such as coaxial cable) in a bus-type topology from which multiple nodes depend. The 10BASE-T draft standard, however, requires a star-type topology (when three or more nodes are present) due to the twisted-pair medium. This star-type topology has a repeater at a hub of the star. The repeater functions to receive data from one of a plurality of ports. After extracting an embedded clock signal from the data, the repeater processes the data with its own internal clock. The repeater then broadcasts to all of its ports the newly timed and amplitude-corrected data. A repeater may, if it includes an AUI port or coaxial MAU, connect to a multi-drop bus at one of its ports. Thus, many nodes may connect to the single repeater port.

To meet timing requirements outlined in the IEEE 802.3 Standard, a network has a maximum of four repeaters in any series from one node to any other node. Therefore, the number of available ports on a particular repeater significantly impacts the number of possible users of a network structured using star-topology. Limited port availability on repeaters prevents network growth and limits use of discrete repeater components. Especially considering that star-topology results in one node per repeater port.

Conventional repeaters have virtually unlimited expansion capacity. A network administrator adds ports as necessary and the network increases virtually without bound. Conventional repeaters separate the relay function, the actual repeater, from the medium attachment function of the MAU. That is, the repeater function remains constant and ports are simply added.

To provide this expansion capability, costs of repeaters can be significant. Reduction of repeater costs results from providing monolithic devices incorporating the repeater functions. Further cost reduction is possible by integrating the repeater functions and the MAU functions. However, integration of the MAU and the repeater into a single monolithic device prevents simple addition of ports as was done in the past. Each single chip will have a limited number of ports available due to drive current limitations. As the reader will appreciate, this number will be relatively small. Combining this limited port availability with the further limit of no more than four repeaters in series, restricts the size of networks offered by monolithic devices. For small networks this size limitation is acceptable. Such integrated repeater and MAU units would be unacceptable for larger networks or for instances of anticipated future expansion.

Therefore, a device implemented in monolithic silicon would desirably provide a port expansion mechanism. A repeater would also desirably have the additional function of monitoring for a collision among its ports and responding appropriately.

Collision detection and processing complications develop for repeaters because multiple nodes may be coupled to a single port (for example, an AUI port) through a mixing segment, requiring collision detection from the single port.

The second complication develops from a linking segment connecting two repeaters together. Special circuitry must enable two repeaters sending JAM patterns to each other to cease transmission when these active ports are the only ports left jamming each other. Otherwise, the two repeaters would JAM each other forever.

Repeaters perform multiple functions outlined in section 9 of the IEEE 802.3 Standard and the Twisted Pair Transceiver functions of the draft 10-Base-T standard. Integration of a repeater with a MAU simplifies installation of twisted pair networks as well as decreases overall manufacture installation and hardware costs.

SUMMARY OF THE INVENTION

The present invention provides a method and apparatus for integrating a repeater and multiple MAUs to function as a single repeater with a plurality of ports. The integrated device is expandable and shares common circuit resources among its various port handling functions.

One aspect of the invention integrates medium attachment unit and repeater functions to form an Integrated Multiport Repeater (IMR). The plurality of ports provided with the IMR includes an AUI port and an expansion port. The IMR has a control circuit coupled to each of the plurality of input/output ports, as well as the expansion port. The expansion port is operative with various control signals to permit coupling of two or more IMRs to one another to form a single repeater unit. The intercoupled IMRs function exactly as a single repeater with additional ports. Each individual repeater chip executes a plurality of repeater functions according to the IEEE 802.3 Standard. The expansion bus permits a coordination between the repeater functions of the individual repeater chips to produce the combined repeater unit which executes these repeater functions in relation to all the ports of the several repeater chips making up the repeater unit. The repeater unit permits a predefined activity among pre-specified ports of all the IRMs to be processed as though the multiple devices were a single device. This predefined activity includes, for example, collisions detected or sensed at the various ports.

An embodiment of the present invention includes two or more IMRs that are combinable with each other to function as a single repeater unit. An arbiter function permits a single IMR to access an expansion bus for exchanging information to the other IMRs. The information may include data for repetition or information regarding a single IMR collision state. The arbiter informs all the IMRs of a single repeater unit when more than one IMRs attempt to access the expansion bus.

In a preferred embodiment, an expansion bus combines the expansion ports of two or more IMRs. Signals sent over the expansion bus include five signals; two bidirectional signals, an output signal and two input signals. The bidirectional signals include a DATA signal and a JAM signal. The output signal is a REQUEST signal and the input signals include a COLLISION signal and an ACKNOWLEDGE signal. A conventional arbiter function resolves conflicts among the IMRs seeking access to the bidirectional signals. The arbiter implements a simple function which asserts an output upon assertion of only a single REQUEST signal.

To pass data for transmission from the ports of all the IMRs of a repeater group, a source IMR asserts REQUEST. The arbiter asserts ACKNOWLEDGE to the IMRs if only a single IMR is requesting access. If two or more request access concurrently, then the arbiter asserts COLLISION, informing all the IMRs that a collision is present. A single requesting IMR, asserts the data to be repeated on the DATA line. The other IMRs, detecting the assertion of the ACKNOWLEDGE signal know that data on the DATA line is for broadcast as long as they have not asserted REQUEST. JAM permits a sourcing IMR to drive DATA to correspond to a collision type it experiences.

A single IMR detecting a multiport collision, asserts JAM and deasserts DATA after the arbiter grants it bus control. A single IMR detecting a one port collision, asserts both DATA and JAM to inform the other IMRs of its repeater unit. Assertion of JAM prohibits DATA information from being broadcast from the repeater ports.

Reference to the remaining portions of the specification and drawing permits a further understanding of the nature and advantages of the invention.

BRIEF DESCRIPTION OF THE DRAWING

FIG. 5 is a table summarizing the state of a particular IMR 50 of FIG. 3 in response to the identified combinations of the five expansion signals;

FIGS. 7A, 7B and 7C are schematic diagrams of functional blocks in an IMR 50;

FIGS. 14A, 14B, 14C, and 14D are schematic block diagrams of the STATUS of FIG. 7;

FIGS. 17A, 17B, and 17C are circuit diagrams of the AUICSDET 510 of FIG. 15;

FIG. 20 through FIG. 24 are schematic and block diagrams of the IMRSM 300 and its interaction with the other functional blocks of FIG. 7;

Specifically, FIG. 20 is a functional block diagram showing the connections and signals the IMRSM 300 receives from the other functional units;

FIG. 21 is a block diagram of the IMRSM 300 comprising a transfer state machine (XFRSM) 950, a transfer control (XFRCTL) 952, and a transfer counter (XFRCNT) 954;

FIG. 23 is a schematic diagram of XFRCTL 952;

FIG. 24 is a block diagram illustrating operation of the XFRCNT 954; and

DETAILED DESCRIPTION OF A PREFERRED EMBODIMENT

Figure 1:
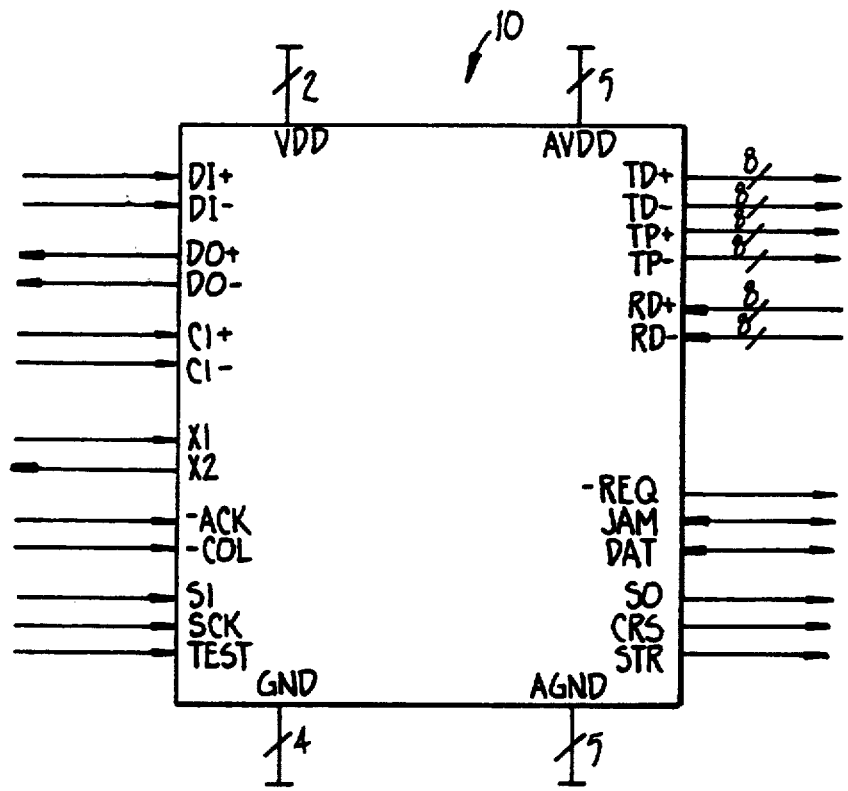
FIG. 1 illustrates one possible pin configuration of an integrated circuit (IC) device 10 embodying the present invention.

FIG. 1 illustrates one possible pin configuration of an integrated circuit (IC) device 10 embodying the present invention. Eight medium attachment units (MAUs) and an attachment unit interface (AUI). Each MAU uses one of the lines TD+, TD−, TP+, TP−, RD+ and RD− as disclosed in the referenced and incorporated pending patent application. The AUI includes the DI+, DI−, DO+, DO−, CI+ and CI− as also described in the incorporated patent application.

The IC device 50 is combinable with one or more other IC devices 10 to provide a single repeater unit. The IC device 10 includes pins for two bidirectional signals DATA and JAM. Included with IC 10 is an output pin for REQUEST, and two input pins for ACKNOWLEDGE and COLLISION signals. X1 and X2 are pins for an external clock used to synchronize all the IC devices 10 when configured as a repeater unit. Not shown is a pin for an external reset function which similarly synchronizes internal clocks. The IEEE 802.3 Standard includes a description of a state for machine flow specification outlining a minimum set of necessary functions of a repeater. A repeater unit must implement these necessary functions of the IEEE 802.3 Standard. Not shown in FIG. 1 are the state machines of the IC device 10 which implement these necessary repeater functions in the required order.

The five signals, DATA, ACKNOWLEDGE, REQUEST, JAM and COLLISION make up an expansion bus. The expansion bus permits two or more IMRs composing a single repeater unit to exchange semaphores to synchronize the state machines of the individual IMRs. Thus, the IMR distributes the repeater and port functions among all the individual IC devices which comprise a single repeater unit.

The semaphore used includes the following signals. A particular IC device 10 receiving data for repetition, requests access to the expansion bus. Access to the expansion bus permits the particular IC device to supply the received data to the other IMRs of the repeater unit for repetition. Requests for access are made by asserting REQUEST. In the preferred embodiment, REQUEST, ACKNOWLEDGE and COLLISION are all active low. Therefore, assertion of REQUEST results from driving REQUEST at a "0" level.

If the particular IC device receives an asserted ACKNOWLEDGE signal in response to its assertion of REQUEST, it has gained expansion bus control. For a repeater unit, the ACKNOWLEDGE lines as well as COLLISION lines are all parallel connected. Thus, all the IC devices 10 of a repeater group will detect a single assertion of ACKNOWLEDGE or COLLISION. An assertion of the ACKNOWLEDGE signal indicates to IC devices 10 which have not asserted REQUEST that the particular IC device 10 is driving DATA with data to be repeated. The DATA and JAM lines are also connected in parallel. The IC device 10 having expansion bus control provides its data to all the other IC devices 10 simultaneously.

Assertion of COLLISION, instead, in response to an assertion of the REQUEST, indicates occurrence of a collision condition across the ports of the repeater unit to all the IC devices 10. The assertion of COLLISION prevents a requesting IC device from accessing the bus to drive the DATA line or the JAM line.

Collision detection by a single IC device 10 for collisions among its plurality of ports also occurs. Such a collision requires that the single IC device 10 access the expansion port. The JAM line permits the accessing IC device 10 to inform the other IC devices 10 in its repeater unit of the presence of a collision. Assertion of JAM indicates that the DATA line information is not to be repeated. Rather, the status of the DATA line informs the other IC devices 10 of the type of collision. In the preferred embodiment, assertion of DATA concurrent with JAM indicates detection of a receive collision (one port collision). Assertion of JAM and negation of DATA indicates detection of a multi-port collision. Thus, the expansion bus performs functions to synchronize the distributed repeater and port functions.

An arbiter function negates or asserts ACKNOWLEDGE or COLLISION in response to a REQUEST signal. To form an expansion bus according to the preferred embodiment of the present invention, the arbiter receives each REQUEST signal from the first and second IMR at a unique input. The unique input simply identifies a particular IMR which requests access of the expansion bus. The arbiter has two output lines to provide the COLLISION signal and the ACKNOWLEDGE signal to the IMRs, in parallel. There are three collision conditions for a repeater made of multiple IMRs.

A first collision condition has active ports among two or more of the IMRs. In this instance, each IMR asserts REQUEST to the arbiter. The arbiter asserts COLLISION to all the IMRs in response to the concurrent assertion of two or more REQUEST signals. The same result occurs if after the arbiter asserts ACKNOWLEDGE to one IMR, it later receives a second request from a second IMR. The arbiter will deassert (or negate, these terms are used interchangeably) ACKNOWLEDGE and assert COLLISION. The IMRs respond to the collision by generating a jam sequence per the IEEE 802.3 Standard.

A second collision condition results from multiple active ports on a single IC device 10 of the repeater unit IMR. The IMR asserts REQUEST, and gains control of the expansion bus if it is the only IMR requesting access. The IMR experiencing multiport collision informs the other IMRs of its repeater unit, by asserting JAM, that information relayed over the DATA line describes the collision type. Assertion of JAM by an IMR accessing the expansion bus indicates that the IMR detected a collision on its own ports. By deasserting DATA when asserting JAM, the IMR informs the other IMRs that it detects a multiport collision. The IMRs of the repeater unit generate the jamming sequence in response.

A third collision condition results from a single port collision on one IMR through either a linking segment or a mixing segment. Referring to the third collision type as "one port left" in either case emphasizes that the repeater unit treats them both alike. One port left occurs when all ports but one of a repeater unit are transmitting jam sequences to nodes coupled to the repeater unit. Collisions on the two segments types occur for different reasons, but the repeater system responds similarly to both.

An IMR detecting a one port left condition accesses the expansion bus similarly to an IMR detecting its own multiport collision. However, a difference between the two is that an IMR 50 asserts both JAM and DATA, signalling the one port left condition. In this way, the IMRs, per the IEEE 802.3 Standard, begin to "back off" and cease generating jam sequences.

For multiple collision types among the several IC devices 10, the IMRs cease generating jam sequences until the repeater unit identifies a single port in the one port left condition. It is assumed that the single port left connects to another repeater unit and the system operates accordingly, irrespective of the actual node connected to the port. To prevent the two repeaters from jamming each other indefinitely, the state machine requires that jam sequences cease from one port left condition.

Figure 2:
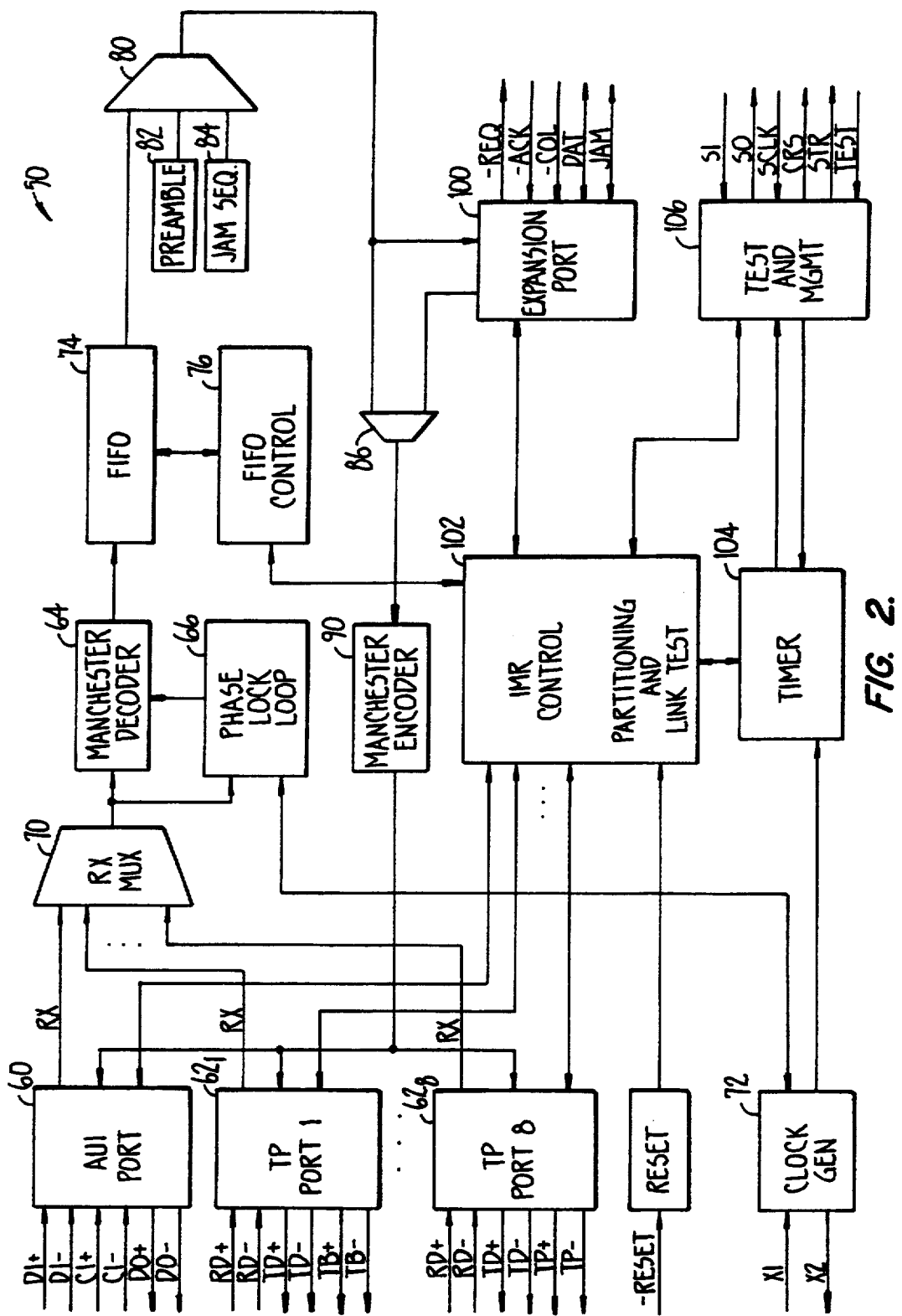
FIG. 2 is a block diagram of an Integrated Multiport Repeater (IMR) 50 according to a preferred embodiment of the present invention.

FIG. 2 is a block diagram of an Integrated Multiport Repeater (IMR) 50 according to a preferred embodiment of the present invention. The IMR 50 includes a plurality (a preestablished number) of ports. An AUI port 60 and eight twisted pair ports $62_i$ couple the IMR 50 to a network. The twisted pair ports $62_i$ conform to the twisted pair draft standard and applicable portions of the IEE 802.3 Standard. Each port $62_i$ operates as a MAU. The twisted pair ports have a line for sending received data (RX) to a decoder 64 and a phase lock loop 66 through a first multiplexer 70. The decoder 64 responds to the phase lock loop 66 for extracting received data by use of an extracted timing clock embedded in the received signal. The phase lock loop 66 uses an independent timing clock received from a clock generator 72. The clock generator 72 responds to an external clocking signal provided at inputs X1 and X2.

A first-in-first-out (FIFO) buffer 74 receives the decoded data from the decoder 64. FIFO control circuitry 76 manages reads from and writes to FIFO buffer 74. IMR 50 not only repeats received data to all its ports, it also conditions the repeated data to be in proper protocol form. Using twisted pair cable allows many types of signal degradations, including timing delays, amplitude distortions and preamble truncations. The repeater strips the incoming data packet of its preamble and substitutes a standard preamble in it place. The repeater retimes and encodes the data with the clock generator 72 to be in proper Manchester form. It is possible that some timing mismatch occurs between the incoming data and the outgoing data because of differences in the clocks. The FIFO buffer 74 provides the necessary elasticity to allow the relatively independent operations of receiving data and repeating the conditioned data. The FIFO buffer 74 comprises one of the inputs into a second multiplexer 80. A preamble circuit 82 and a JAM sequencer 84 are also input into the multiplexer 80. A third multiplexer 86 outputs to an encoder 90. The encoder 90 encodes data received from the third multiplexer 86 and distributes it to the ports for sending to the various nodes. An output of the second multiplexer 80 provides data simultaneously to the third multiplexer 86 and to an expansion port 100. An output of the expansion port also supplies data to the third multiplexer 86. The expansion port 100 includes two bidirectional signals, DAT and JAM. An output signal REQ and two input signals ACK and COL combined with DAT and JAM establish an expansion bus connection.

An IMR control circuit 102 monitors and supervises operation of the IMR 50 in response to various control signals and data. The control circuit 102 contains partitioning and link test circuitry. The control circuit 102 uses various timers from timer circuit 104 and instructions from a test and management port 106 to oversee operation of the ports, the FIFO control circuit 76 and the expansion port 100. Timer circuits 104 are responsive to signals from the clock generator 72 and the test and management port 106.

Figure 3:
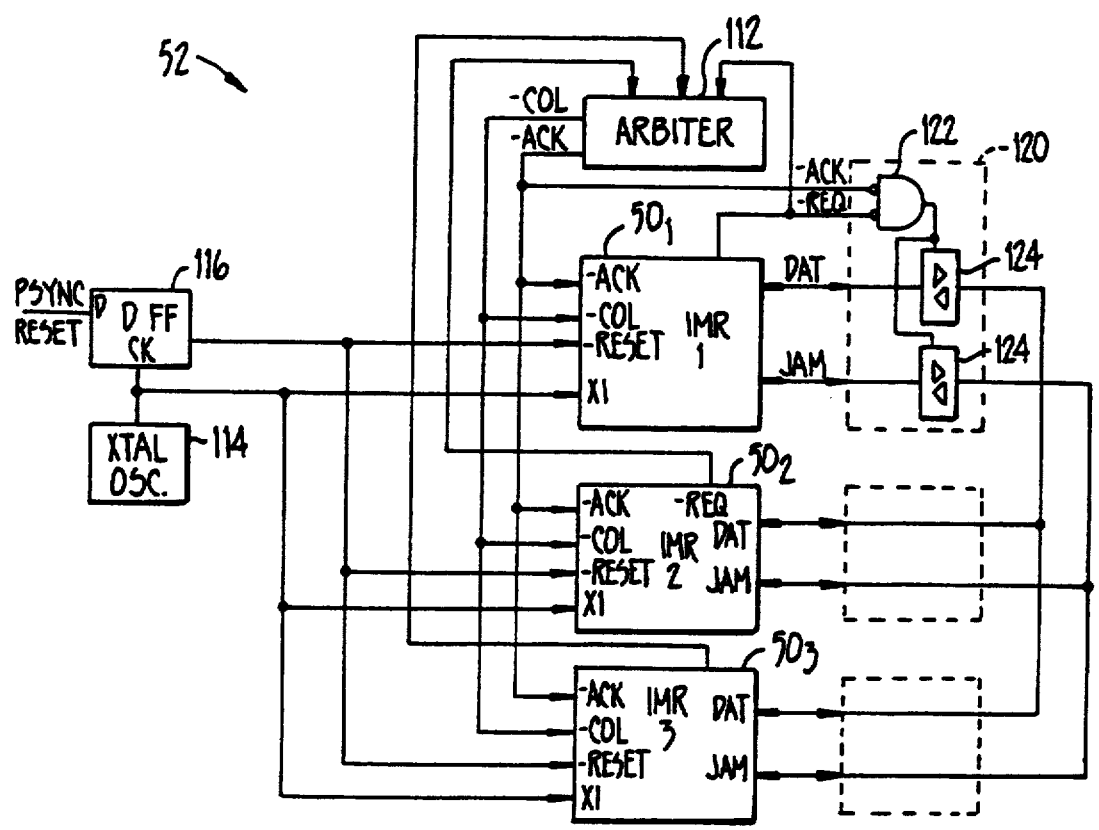
FIG. 3 is a block diagram of three IMR $50_i$ units coupled together to form a single IMR 50'.

FIG. 3 is a block diagram of three IMR $50_i$ units coupled together to form a single IMR repeater unit 52. The repeater unit 52 only counts towards one repeater of the four repeater in series maximum. The repeater unit 52 has three times the number of ports of any single IMR 50 but is otherwise indistinguishable in function from an individual IMR $50_i$.

The IMR $50_i$ enables this functioning because of the expansion port 100 of FIG. 2. Each DAT terminal couples its individual IMR $50_i$ to the other individual IMR $50_i$. This is similarly true for the JAM terminals. An optional driver 120 supplies any additional drive capability if an individual IMR $50_i$ cannot supply or source enough current. The driver 120 provides for a virtually limitless number of IMRs 50 to compose a single repeater unit. An external arbiter function 112 manages operation of the expansion protocol, permitting the repeater unit 52 operation. Arbiter functions are standard and useable with the present invention. The arbiter function 112 receives the individual REQ signals from the individual IMRs $50_i$. A single COL signal and a single ACK signal from the arbiter function 112 complete the expansion bus by coupling to respective terminals of the individual IMRs $50_i$.

A single crystal oscillator 114 provides common clock signals to the individual IMRs $50_i$ and to a D-type flip/flop 116. The common crystal 114 ensures that the individual IMRs $50_i$ operate and encode the data in unison. The D flip/flop 116 resets the devices together.

The optional driver 120 includes a logic gate 122 for selectively enabling drivers 124. Logic gate 122 is responsive to concurrent assertion of REQUEST and ACKNOWLEDGE to enable a particular optional driver 120 associated with each IMR 50. Enabling the optional drivers 120 allows an assertion of either DATA or JAM or both, to be asserted to all the IMRs 50. The semaphores exchanged between the IMRs 50 are as described above.

Figure 4:
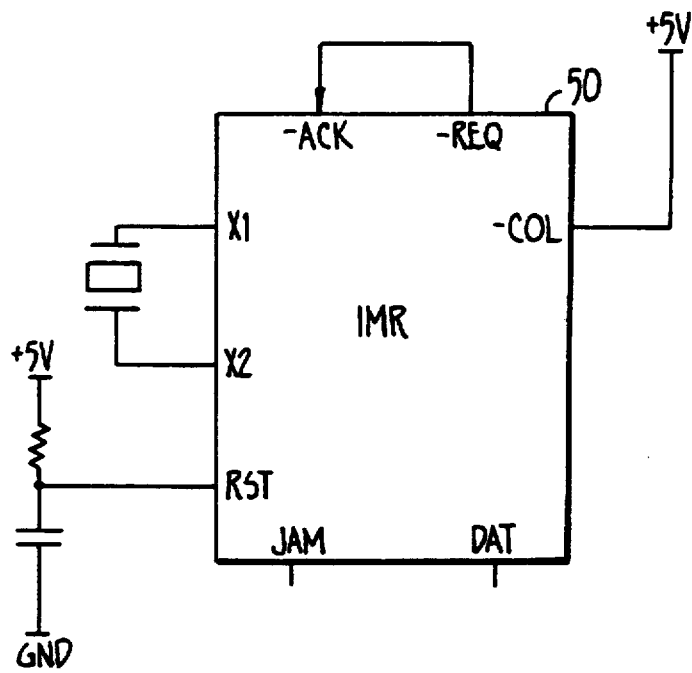
FIG. 4 is a schematic block diagram illustrating configuration of external components permitting IC device 10 to function as an integrated multi-port repeater (IMR)

FIG. 4 is a schematic block diagram illustrating configuration of external components permitting a single IMR 50 to function as an integrated multiport repeater (IMR) unit 52. The REQUEST and ACKNOWLEDGE lines are tied together to provide the arbiter function. Assertion of REQUEST automatically asserts ACKNOWLEDGE. COLLISION is tied to a voltage level indicating no collision. DATA and JAM are left floating. An external clock source, such as a crystal oscillator, provides clock signals used to retime data for transmission. The reset line is coupled to a "1" voltage level through a resistance and to ground through a capacitance.

The IMR 50 functions as a repeater unit with 8 twisted pair MAUs and an AUI port. Repeater and port functions are distributed in the IMR 50.

FIG. 5 is a table summarizing the state of a particular IMR 50 of FIG. 3 in response to the identified combinations of the five expansion signals. The signals correspond as follows: REQ=REQUEST, ACK=ACKNOWLEDGE, COL=COLLISION, DAT=DATA, and JAM=JAM.

Figure 6:
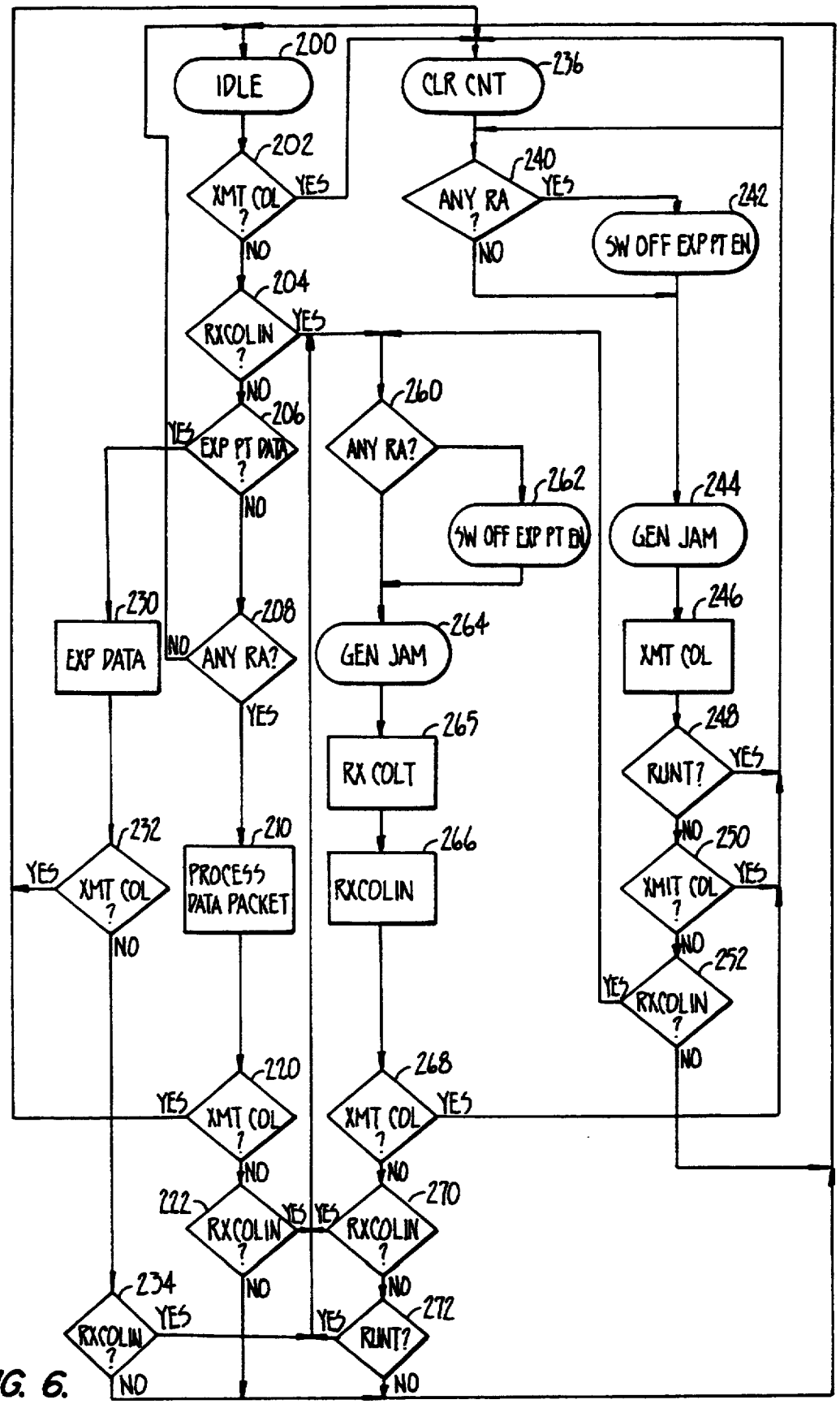
FIG. 6 is an abbreviated flow chart diagramming a preferred state machine process for the repeater unit 52.

FIG. 6 is an abbreviated flow chart diagramming a preferred state machine process for a source IMRs in the repeater unit 52. For exchange of information after a particular IMR 50 is granted bus mastership by the arbiter function 112 (FIG. 3), the particular IMR 50 is the source IMR while the others are target, or destination, IMRs. The state machine of the source IMR responds as outlined in the flow chart.

The process begins at step 200, IDLE. Periodically, the state machine cycles through a set of tests which include: detection of transmit collision (XMT COL) 202, detection of receive collision (RX COL) 204, detection of expansion port data to be repeated (EXP PT DATA) 206, and detection of any receive activity other than at the expansion bus for a particular IMR 50 (ANY RA) 208. Without data received by the repeater unit 52, the state machine cycles through IDLE 200 to XMT COL 202 (false), to RX COL 204 (false), to EXP PT DATA 206 (false), and ANY RA 208 (false), to return to IDLE 200.

Detection of any receive activity at a particular IMR 50, other than at the expansion port, ANY RA 208 (true), directs the flow of the repeater unit 52 to process the data packet per the IEEE 802.3 Standard. Step 210 illustrates the processing of the data packet received at a port. Part of step 210 includes gaining control of the expansion bus and driving DATA appropriately in response to an ACKNOWLEDGE signal from an arbiter function 112 of FIG. 3. After processing the data packet at step 210, the flow returns to IDLE 200 step. Part of the processing of step 210 includes periodic checks for transmit collisions (XMT COL) 220 (true) and receive collisions (RX COL) 222 (true). Step 220 and step 222 are illustrated as occurring after step 210, but are periodically interspersed throughout step 210. Step 210 includes a plurality of states of the repeater unit 52, shown condensed in FIG. 6. Not detecting XMT COL 220 true or RX COL 222 true results in a completion of data packet processing and a return to IDLE 200.

An IMR 50, upon detecting ACKNOWLEDGE at test EXP PT DATA 206, branches to steps 230 through 234. Step 230, expansion port data (EXP DATA) 230 processes data on the expansion port by repeating it among its ports. Step 232 tests for a XMT COL and step 234 tests for RX COL. Detecting neither collision type results in a return to IDLE 200.

A detection of a transmit collision at any one of step 202, step 220, or step 232 directs processing of the transmit collision to step 238 through step 252. A transmit collision may be true in at least four instances. First, a multiport collision among an IMR's own ports may be present. Second, an IMR's receipt of a data packet may coincide with a data packet of a second IMR. Third, two other IMRs may detect a collision. Fourth, one other IMR may detect a multiport collision among its own ports. In all the instances except the first, the detection of the collision occurs over the expansion bus. For instances two and three, the expansion bus will include assertion of COLLISION to notify all the IMRs of the repeater unit of the collision. In the fourth case, the single IMR gains access to the expansion bus and asserts JAM and negates DAT.

Upon XMT COL true, a counter is cleared (CLR CNT) at step 236 and step 240 tests whether its IMR 50 detects any receive activity among its ports (ANY RA). The counter is cleared and used to ensure that a minimum number of jam bits have been transmitted. If ANY RA is true, the system arbitrates for the expansion bus, which upon being granted bus control, deselects its own DAT and JAM thereby ignoring its output signals as input signals, at step 242. If ANY RA 240 is false, the process goes directly to step 244 for generation of appropriate jam sequences. After initiating arbitrating and deselecting DAT and JAM inputs, at step 242, the flow also goes to step 244. After generation of jam sequences, the system enters the transmit collision state at step 246.

After step 246, the system tests, at step 248, by use of the counter, to determine if a minimum of 96 bits have been transmitted (RUNT). RUNT true directs the flow to step 240. RUNT false directs the flow to test XMT COL at a step 250. XMT COL 250 true directs the flow to step 240. Step 252 tests for a receive collision (RX COL) after step 250 XMT COL false.

RX COL 252 testing true executes appropriate steps of the receive collision block, steps 260 through 272. After step 252 RX COL false, the system returns to IDLE 200.

The receive collision block, steps 260 through 272, includes a test at step 260, ANY RA test. Step 260 ANY RA true disables receipt of input signals DAT and JAM from the expansion port. Receive collisions from the expansion port are only passed to other IMRs of a repeater group through assertion of both DATA and JAM. After either of ANY RA false or disablement of the expansion port at step 262, the state machine initiates generation of jam sequences (GEN JAM) at step 264. Step 265 sets a the receive collision state by setting RX COLT true. RX COLT distinguishes between receive collisions and transmit collisions in the state machine. Step 266, following step 265, identifies the system as entering the receive collision state.

A XMT COL test at step 268 and a RX COL test at step 270 follows the receive collision state 266. XMT COL true directs the flow to step 238, clearing the counter prior to testing for receive activity at step 240. RX COL true returns the flow to step 260. RUNT 272 follows determination at step 268 XMT COL false and step 270 RX COL false. RUNT true at step 272 returns the state machine flow to step 260 while RUNT false directs the flow to IDLE at step 200.

As described above, the preferred embodiment of the present invention includes distributed repeater state machine functions which are synchronized and informed regarding the various collision modes of the repeater. The synchronizing of the state machines correlates operation of the individual IMR functions to permit the repeater group 52 to execute those repeater functions for the an entire combination of IMRs. The state machine flow chart of FIG. 6 identifies some modifications to the state machine flow outlined in IEEE 802.3 Standard. In general, the precise type of changes to a particular repeater state machine to permit distributed repeater functions will vary depending upon particular implementations and design choices, that is, the method used to implement the state machine of the IEEE 802.3 standard.

Figure 7A:
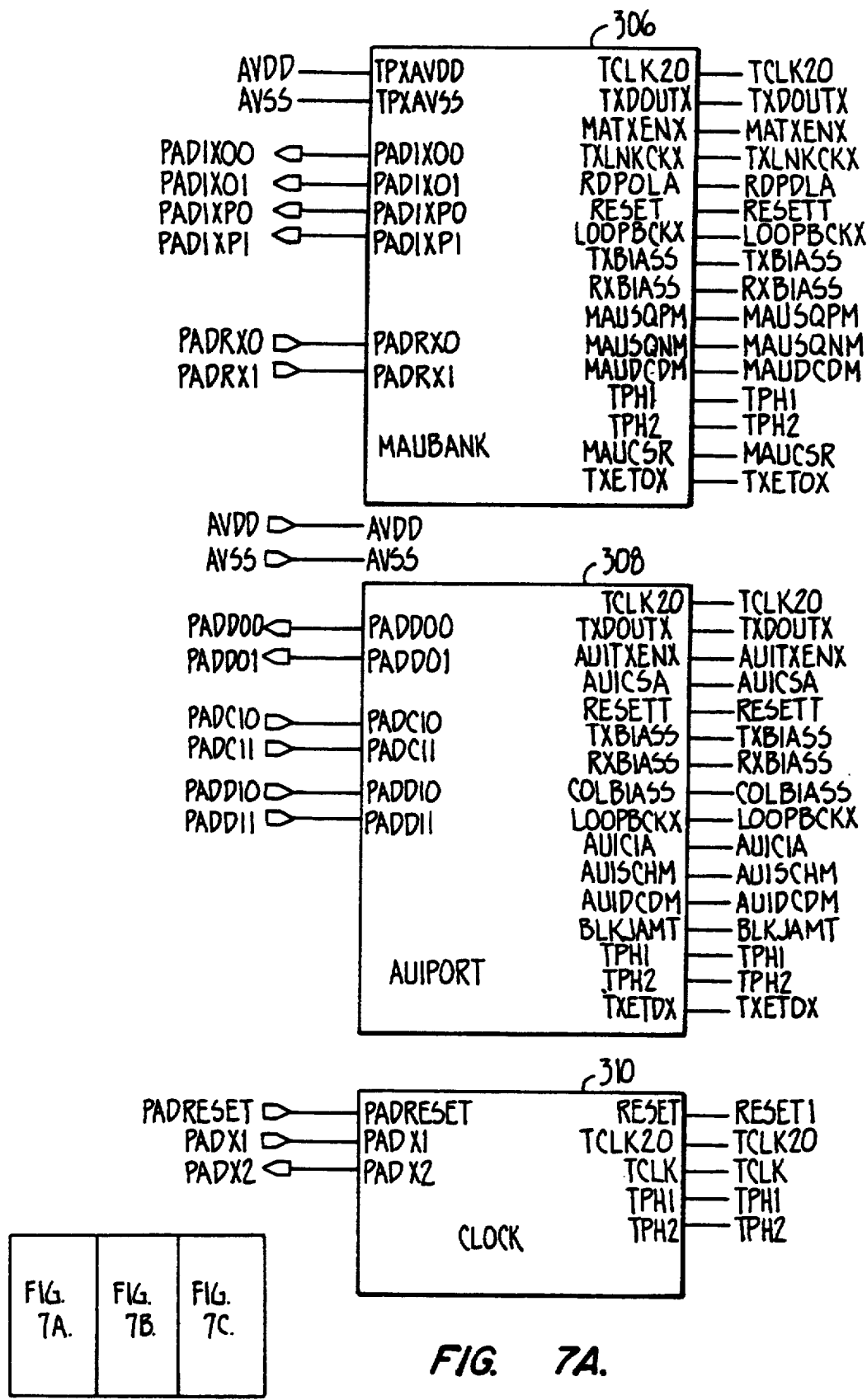
Figure 7C:
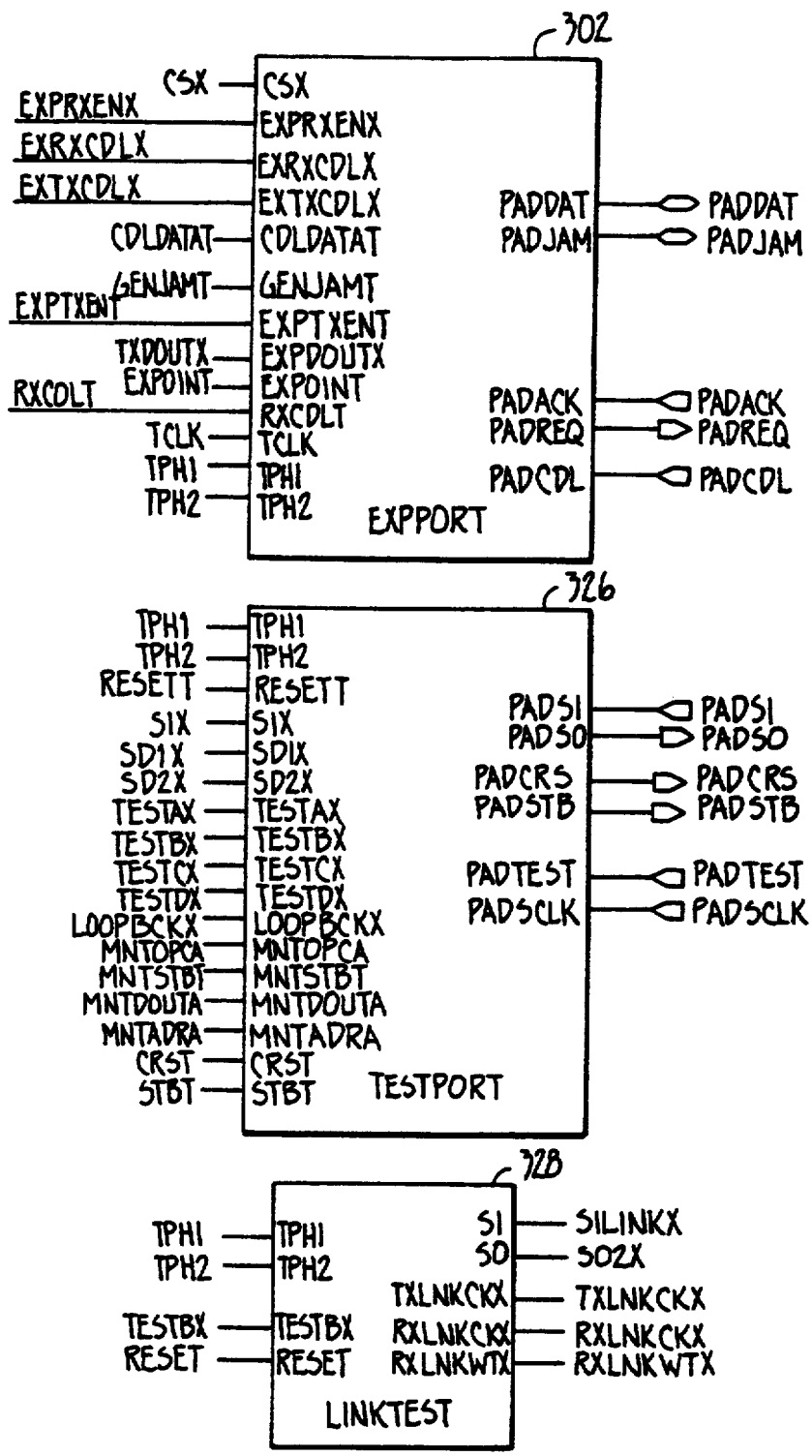
Figure 14A:
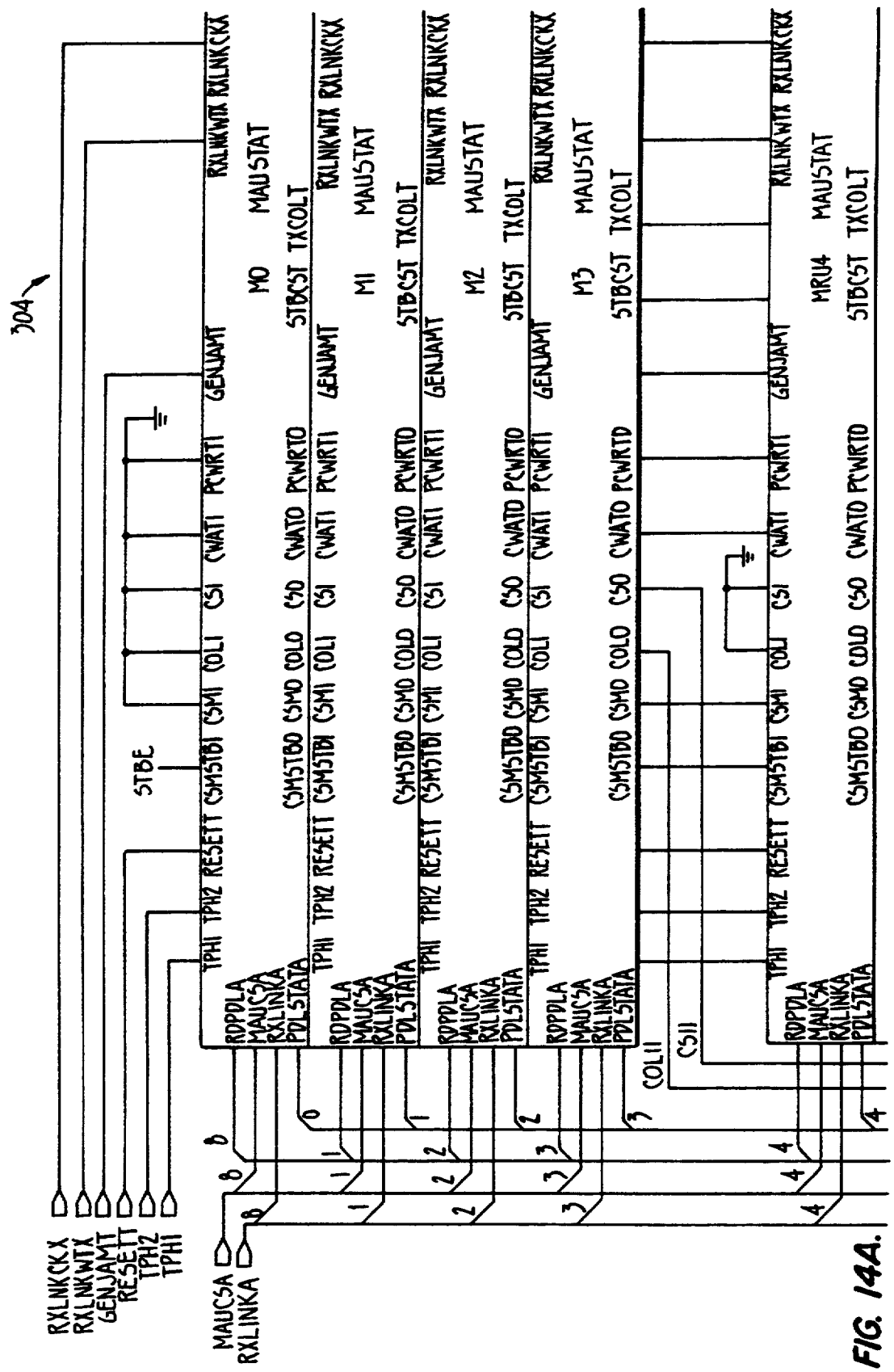
Figure 14C:
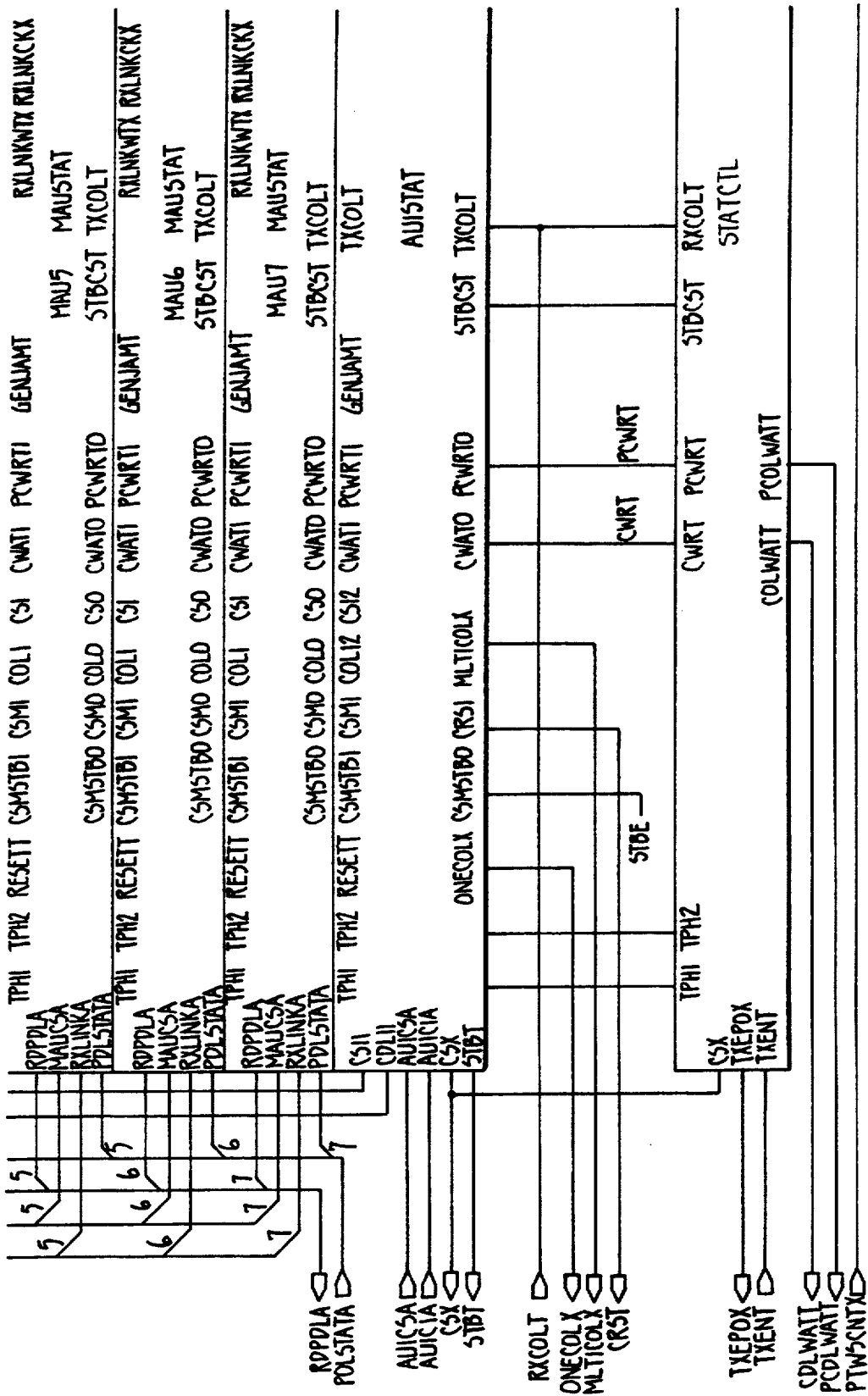
Figure 14D:
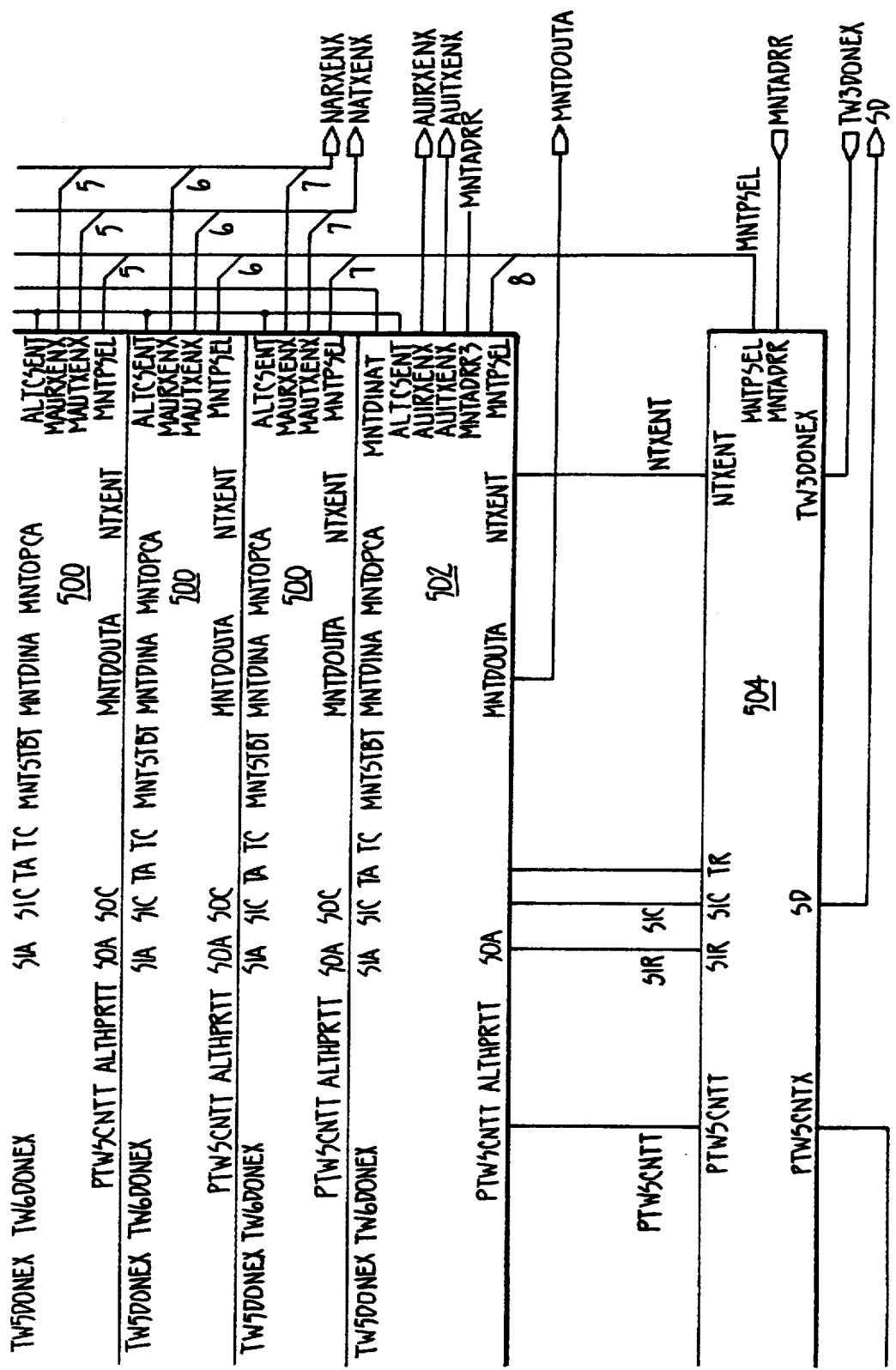
Figures 15, 15A:
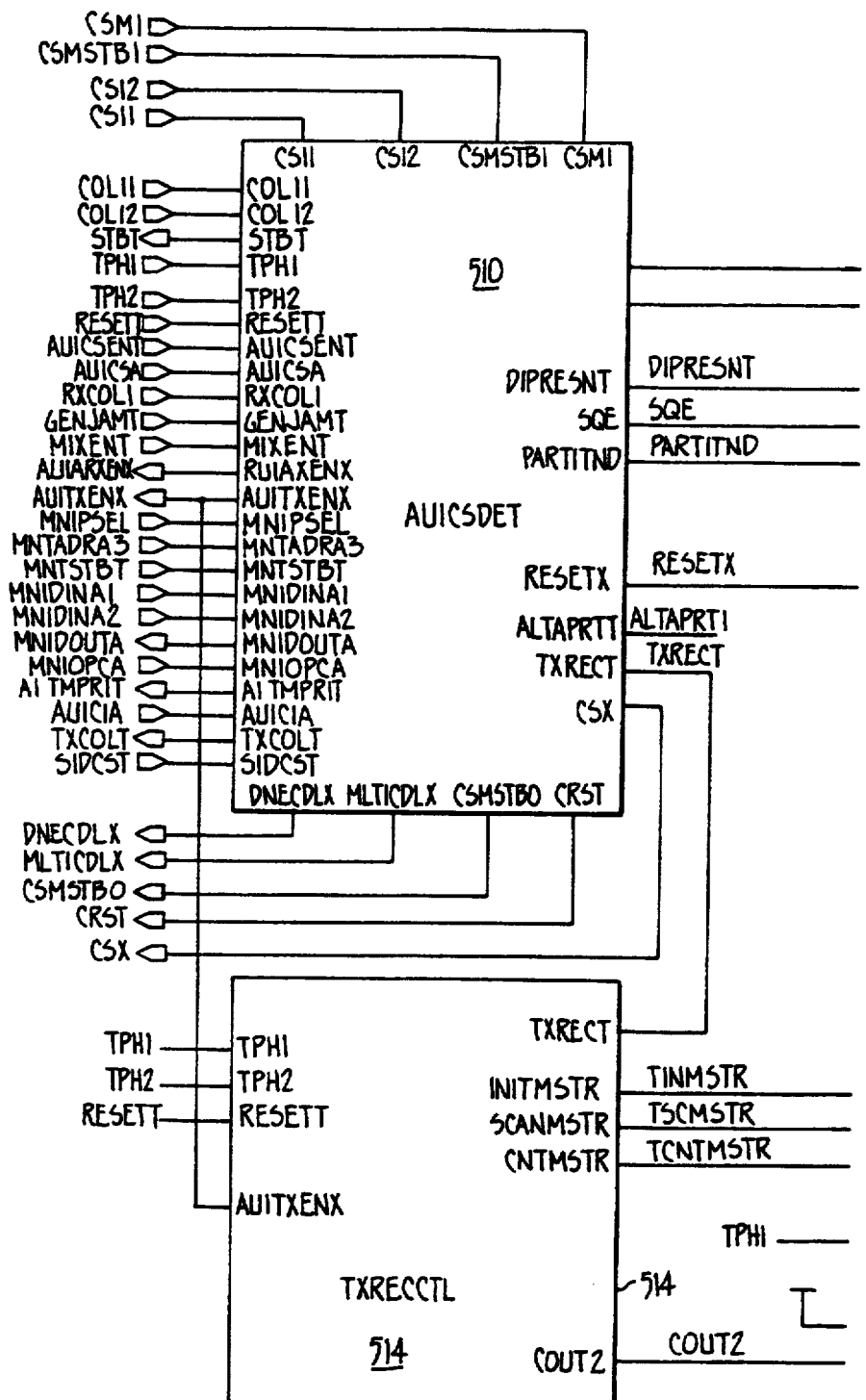
FIGS. 15A, and 15B are schematic block diagrams of an AUISTAT
Figure 15B:
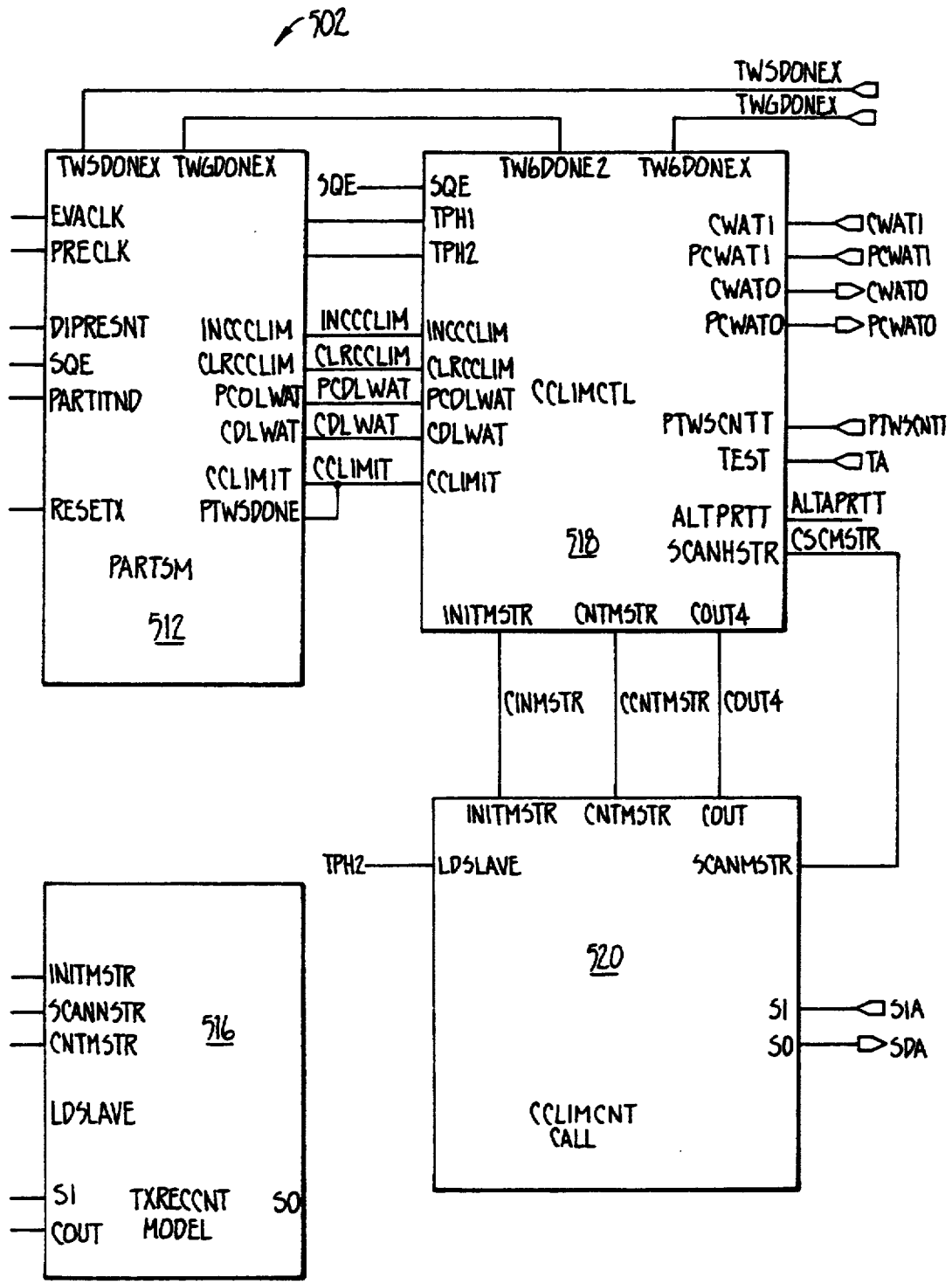
Figures 16, 16A:
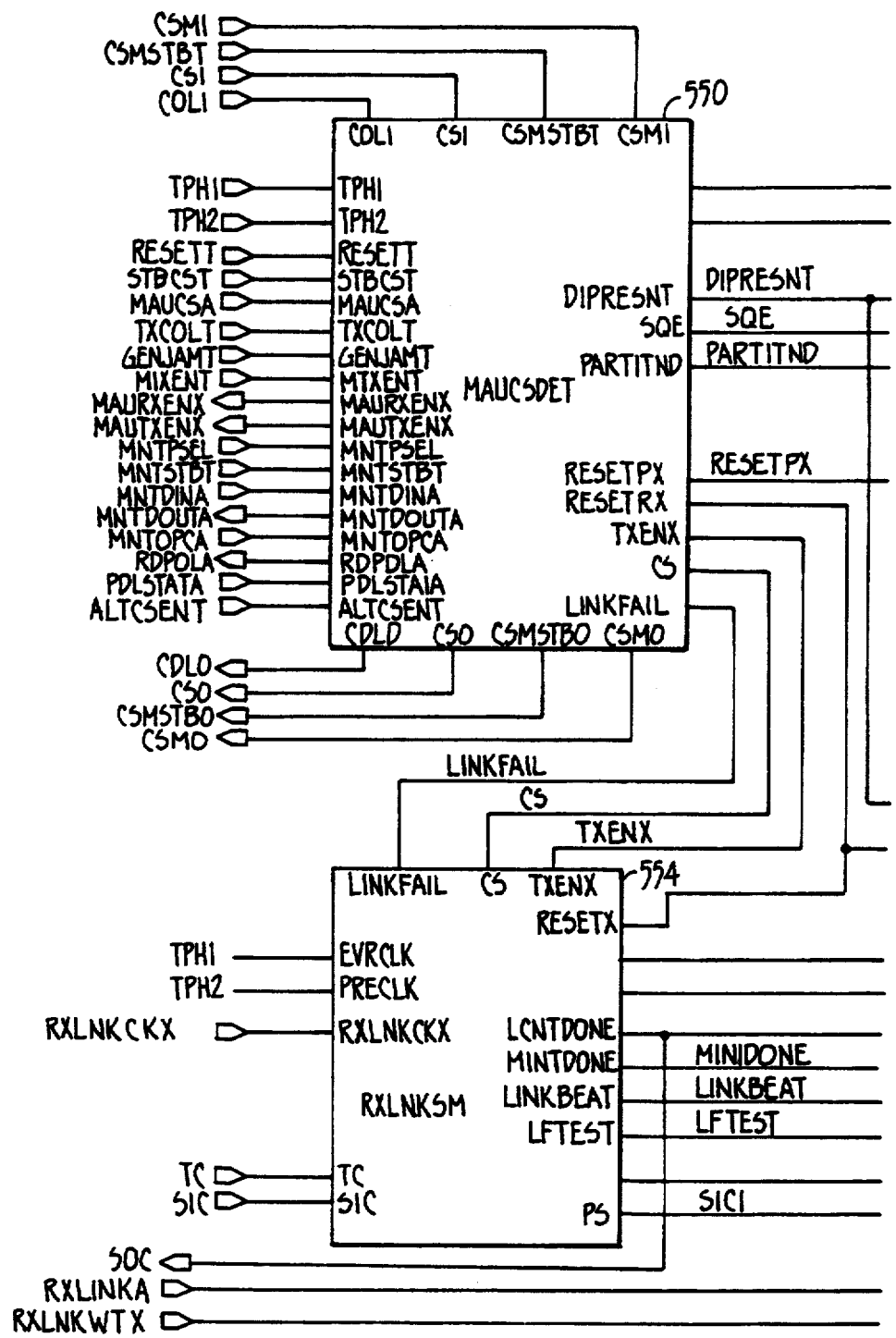
FIGS. 16A, and 16B are schematic block diagrams of an MAUSTAT of FIG. 14.
Figure 16B:
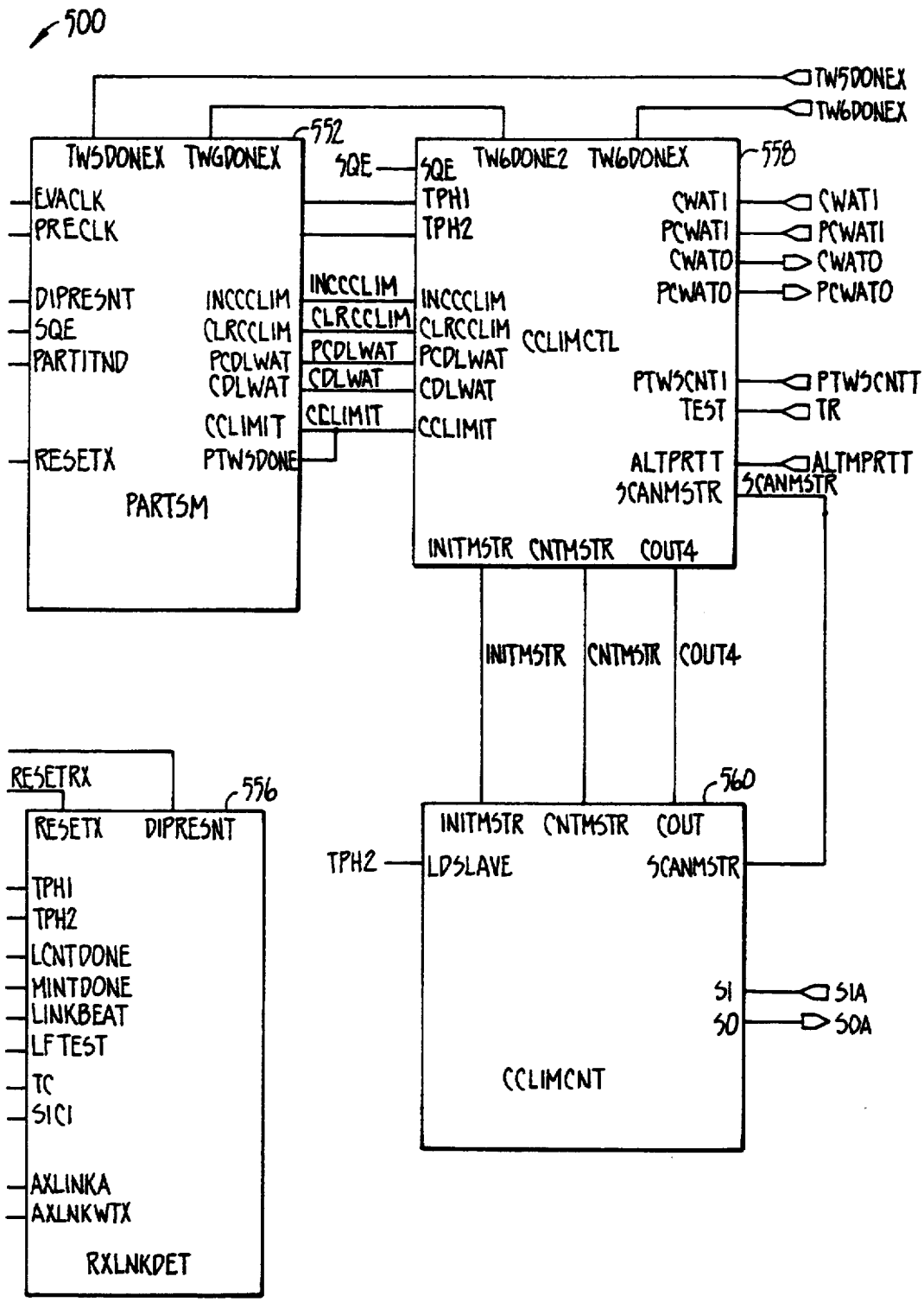
Figure 17B:
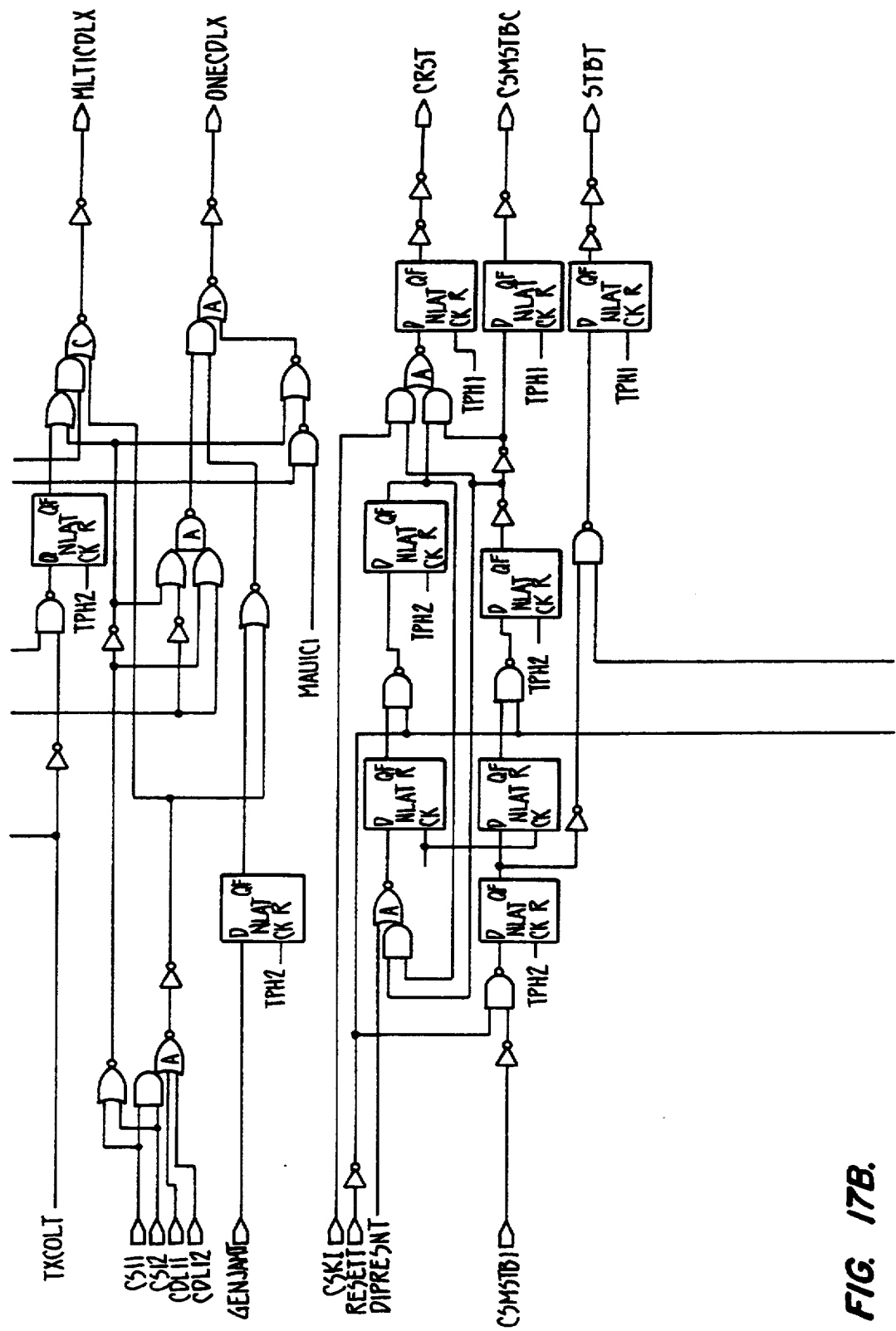
Figure 17C:
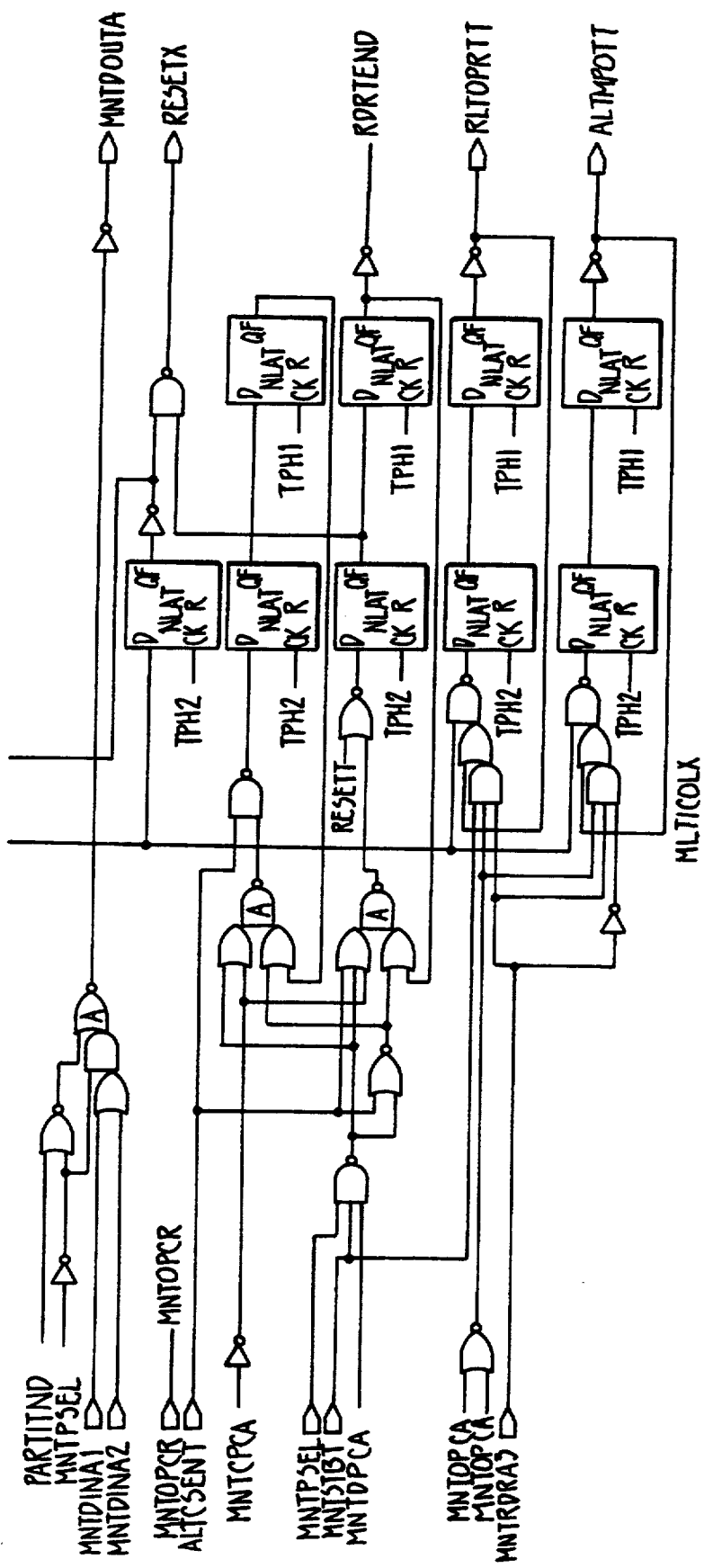
Figure 18A:
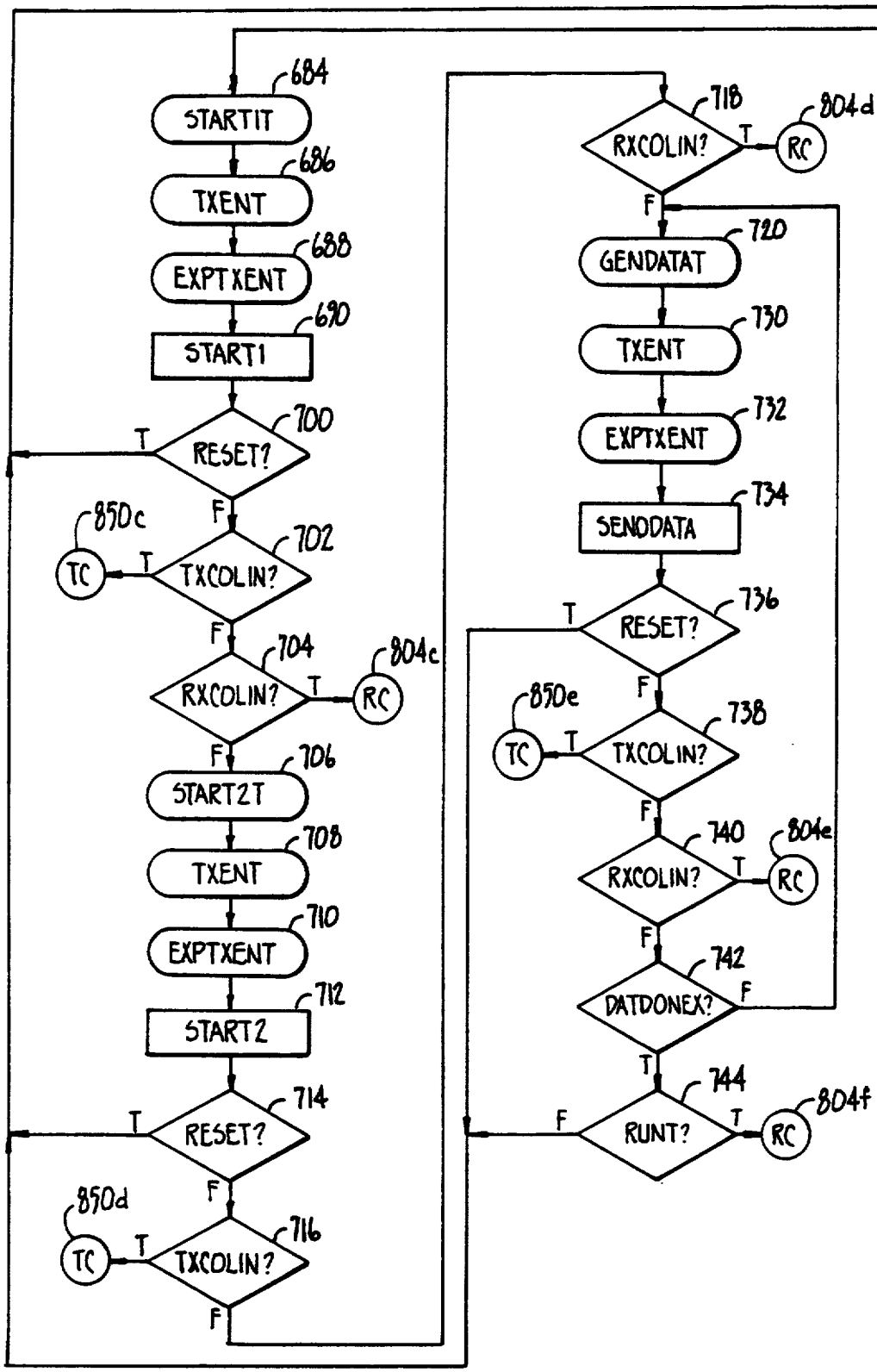
FIGS. 18LA, 18B, 18C, and 18D are detailed IMRSM 500 flow charts outlining the functions of the state machine using the signal representations of FIG. 7 through FIG. 18.
Figure 18B:
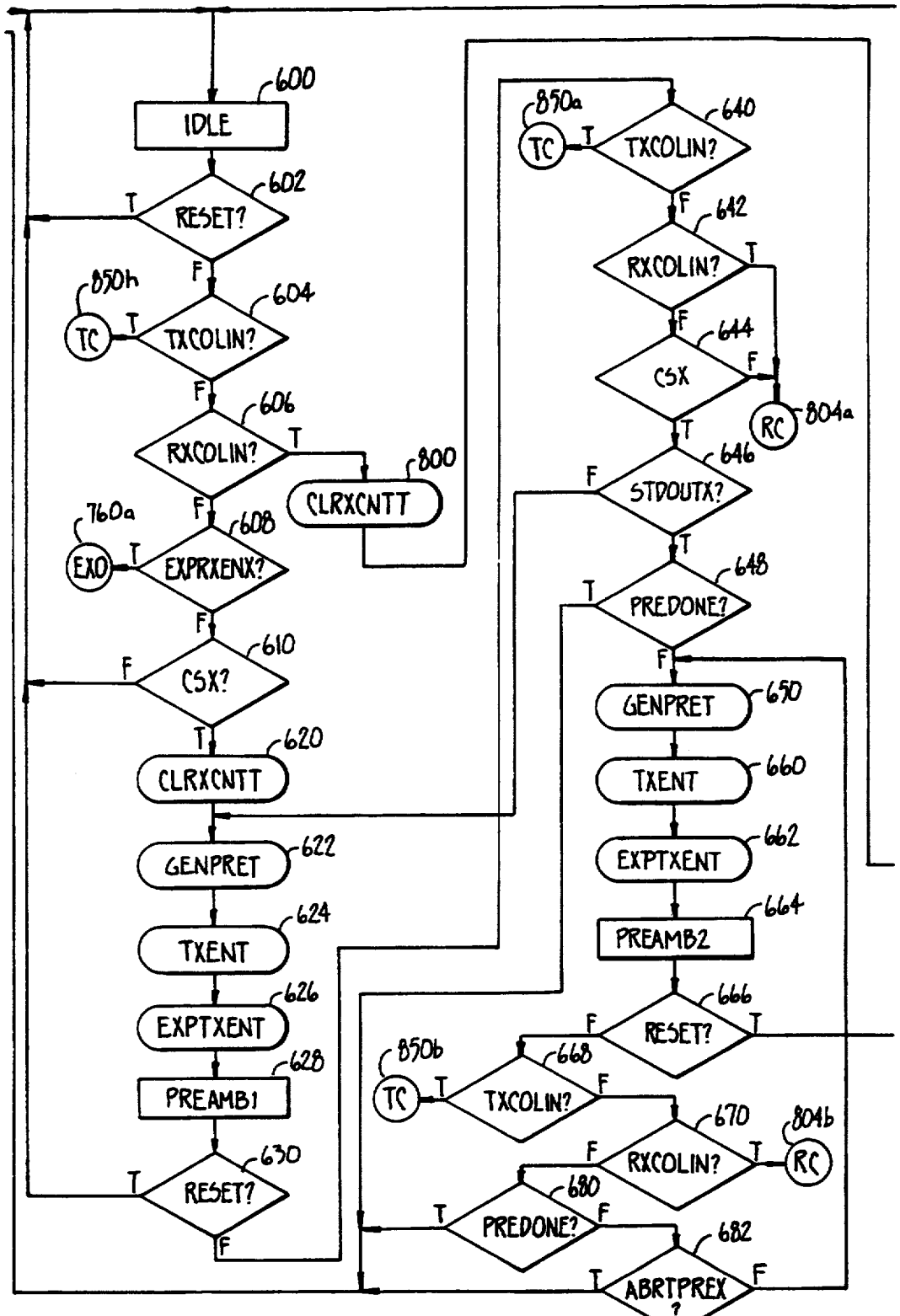
Figure 18C:
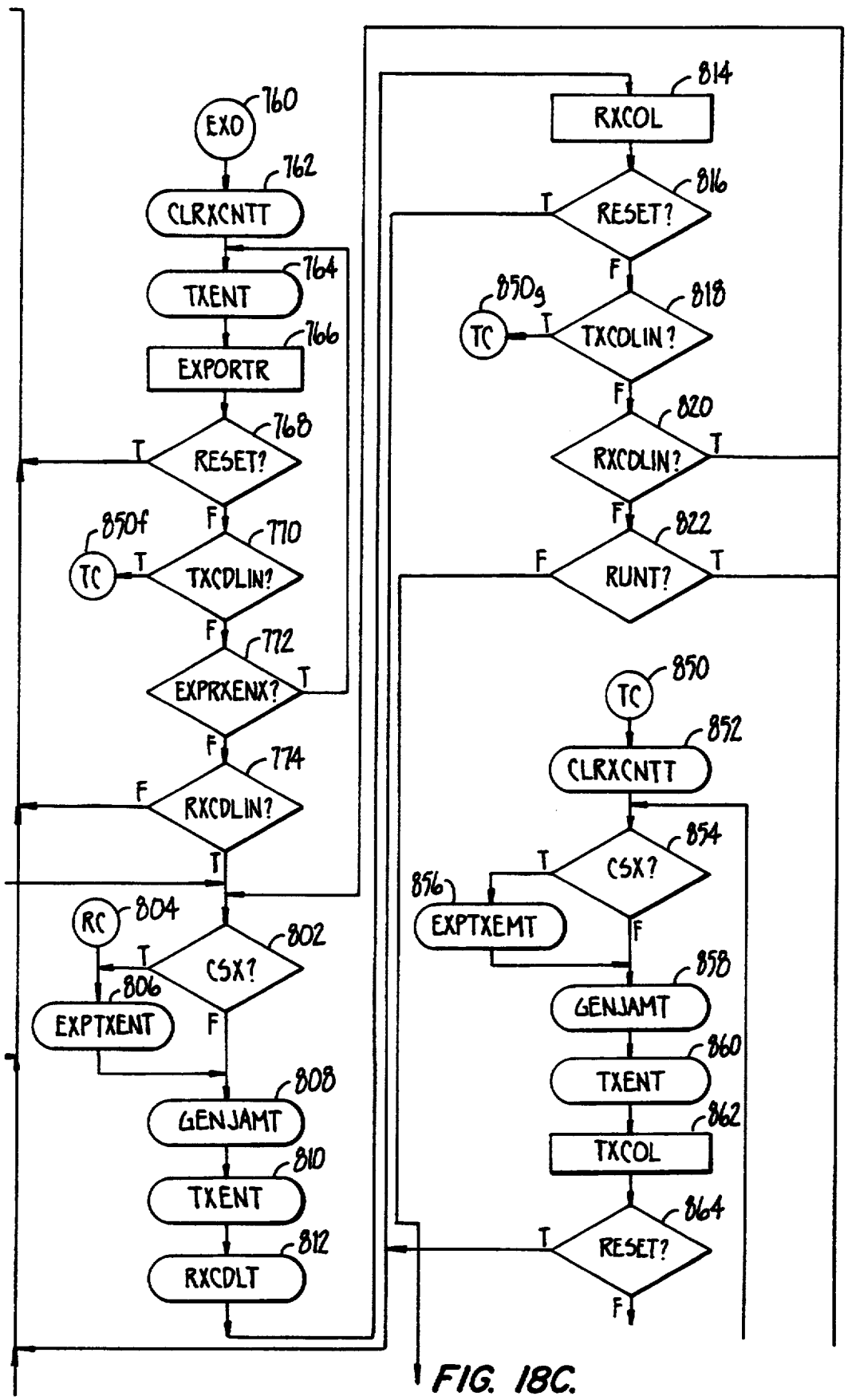
Figure 18D:
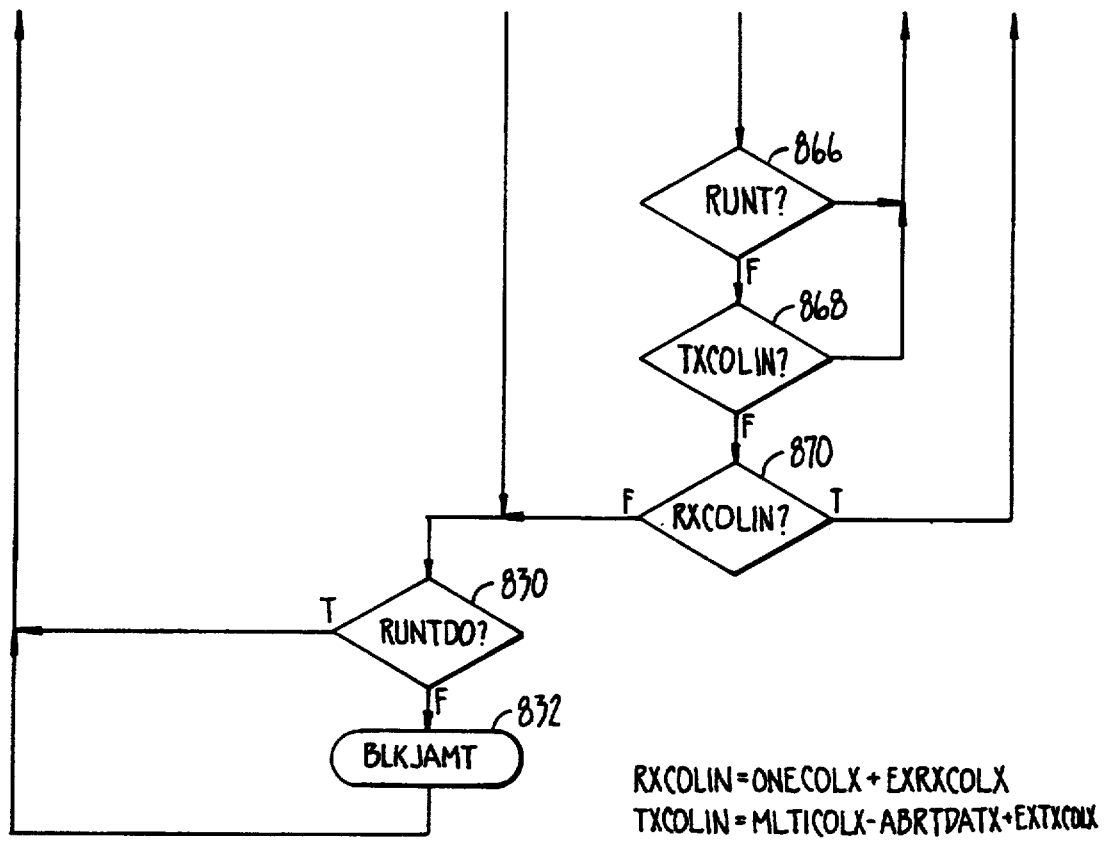
Figure 18:
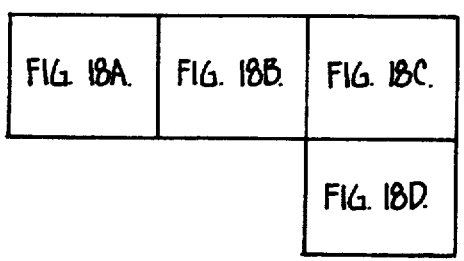

FIG. 7 through FIG. 18 and FIG. 20 through FIG. 2.4 are schematic block diagrams of the functional and circuit diagrams implementing the controls to an IMR state machine 300 of an IMR 50 according to a preferred embodiment of the present invention. FIG. 7 illustrates the manner in which FIGS. 7A-7C are combined, FIG. 14 illustrates the manner in which FIGS. 14A-14D are combined, FIG. 15 illustrates the manner in which FIGS. 15A-15B are combined, FIG. 16 illustrates the manner in which FIGS. 16A-16B are combined, FIG. 17 illustrates the manner in which FIGS. 17A-17C are combined, FIG. 18 illustrates the manner in which FIGS. 18A-18D are combined, and FIG. 22B illustrates the manner in which FIGS. 22B$_1$ and 22B$_2$ are combined.

FIG. 7 is a schematic diagram of functional blocks in an IMR 50. The IMR 50 includes the IMR state machine 300 receiving and sending signals primarily with respect to an expansion port (EXPPORT) 302 and a status (STATUS) 304 block. The EXPPORT 302 connects the IMR 50 to the expansion bus described above and includes connections for the five expansion bus signals. A MAUBANK 306 and an AUIPORT 308 provide the ports for the IMR 50. A clock 310 function receives the external clock signals from the crystal oscillator 114 and receives any reset signal.

A data buffer (DATABUF) 320 supplies some signals to the IMR state machine 300 as well as the STATUS 304 and the EXPPORT 302. The IMR 50 includes a receiver back end (RXBCKEND) 322 and a behavior counter (BEHAVCNT) 324 which monitors collision duration and jabber function. A test port (TESTPORT) 326 and link test functions (LINKTEST) 328 complete the functional blocks of the IMR 50.

FIG. 20 through FIG. 24 are schematic and block diagrams of the IMRSM 300 and its interaction with the other functional blocks of FIG. 7.

Figure 20:
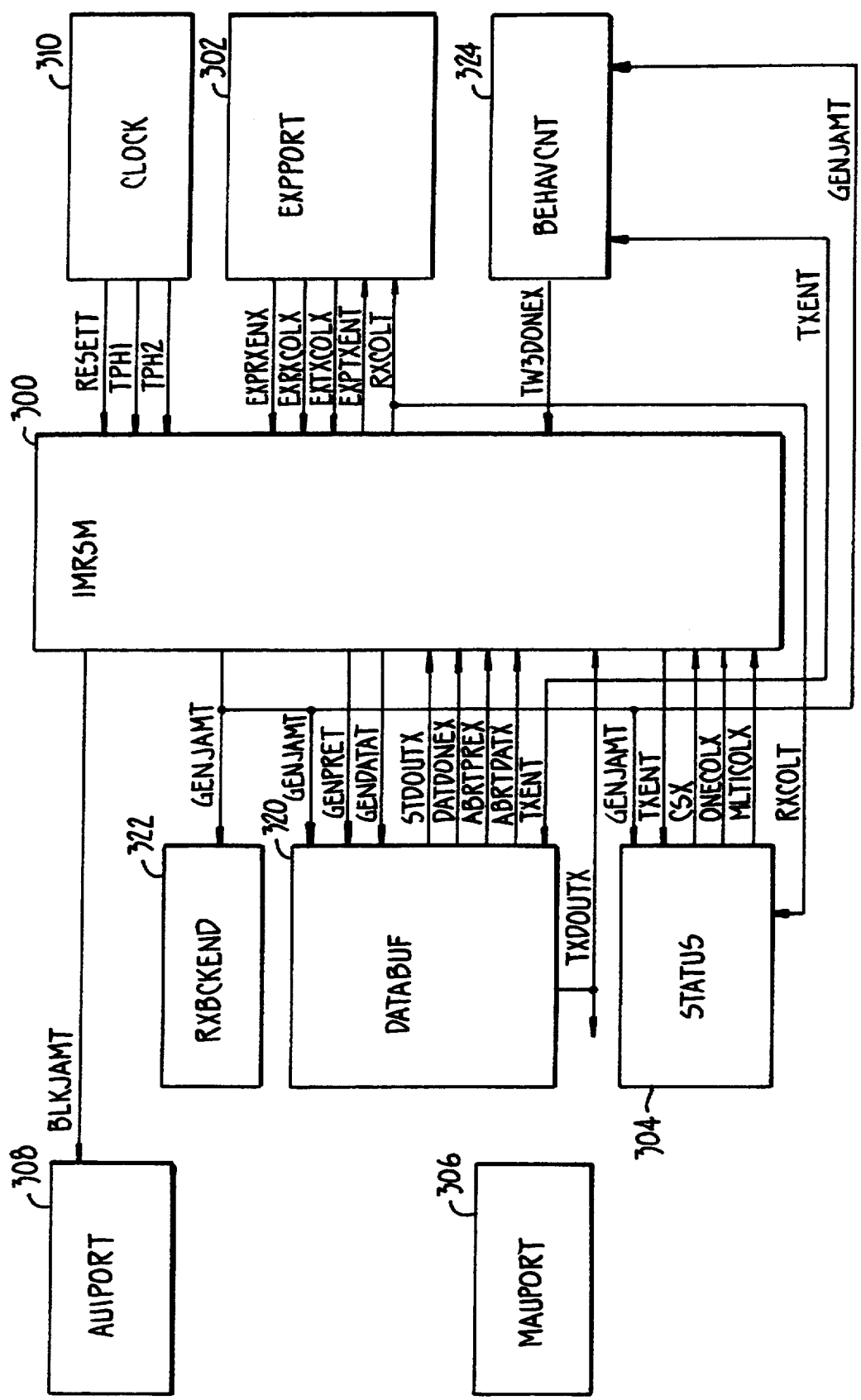

Specifically, FIG. 20 is a functional block diagram showing the connections and signals the IMRSM 300 receives from the other functional units. The IMRSM 300 comprises a state machine controlling preamble, FIFO data, and jam pattern transmissions (a transfer state machine). Additionally, a physical transfer timer combines the functionality of a preamble timer, runt packet timer and jam length timer. Glue logic supports the transfer state machine and the physical transfer timer.

The transfer state machine is substantially equivalent to the IEEE 802.3 Standard repeater state diagram. A state machine equivalent to the IEEE 802.3 Standard is unaware of a specific port type, AUI or twisted pair MAU, involved in a particular transmission. The status block 304 identifies a receive port and a transmit port at any point in time. The IMRSM 300 includes an additional state to the IEEE 802.3 Standard state diagram to allow expansion port data receive conditions to control separate transmit enable signals for the expansion port versus all other ports.

Random logic implements the state machine. Evaluation phasing of the state machine permits use by the DATABUF 320 to provide data for the TCLK rising edge bit boundaries of port transmitters. The CLOCK 310 receives either a 20 MHz signal from an external crystal, single IMR 50 operation, or a 20 MHz crystal oscillator for single or multiple IMR 50 operation. The CLOCK 310 receives an asynchronous reset signal which is synchronized to the 20 MHz signal. The CLOCK 310 uses a divide-by-two circuit to provide a single-ended 10 MHz clock for use in port transmit circuits. A two-phase non-overlapping clock generator produces two 10 MHz clock waveforms (TPH1 and TPH2) from the single-ended 10 MHz clock waveform (TCLK). TPH1 and TPH2 time digital logic in the port transmit circuits.

TCLK20, the 20 MHz clock signal, rising edges drive transmit data from the ports. Note that every second TCLK20 edge roughly corresponds to a TCLK rising edge. Inputs to the state machine arrive on rising edges of TPH2. Evaluation and assertion of new outputs occurs on rising edges of TPH1. This quick operation in terms of clock edges is permissible due to the slow clock speed relative to process performance and to the small size of the state machine.

Specifically, the IMRSM 300 receives RESETT, TPH1 and TPH2 from the CLOCK 310. The EXPPORT 302 receives an indication of receive data at the expansion port (EXPRXENX), a sampled state of the expansion port JAM pad (PADJAM) and DAT pad (PADDAT) lines for a destination IMR 50 (EXRXCOLX) corresponding to a receive collision, and a sampled state of the expansion port PADJAM and PADDAT lines for a destination IMR 50 (EXTXCOLX), corresponding to a transmit collision and incorporates collisions between multiple IMRs 50 of a repeater group 52. The IMRSM 300 provides expansion port transmit enable (EXPTXENT) and an indication that the IMRSM 300 is in the receive collision (RXCOL) state (RXCOLT). The EXPPORT 302 delays EXPTXENT ½ TCLK before use to provide timing consistent with that of the data (preamble, data, or jam) (EXPDOUTX). EXPPORT 302 transmits RXCOLT from PADDAT by a source IMR 50, and allows all the IMRs 50 of a repeater group 52 to independently count minimum jam sequences.

The BEHAVCNT 324 provides an indication to the IMRSM 300 when a jabber timer expires (TW3DONEX) TW3DONEX initializes a runt packet counter preventing runt packets in the event that transmission is re-enabled. TW3 is the jabber_length per the IEEE 802.3 Standard. A 16 bit counter implements the jabber timer included in a scan test path of the IMRSM 300. The jabber timer evaluates a next count prior to a count request, but does not store the new count in its master state latch until requested to count. Thus, a TPH2 count request will result in the storage of a new count during the subsequent TPH1 in a master latch, with related flags issued on the following TPH2. This timing scheme allows nearly one full 10 Mhz clock cycle for counter evaluation. The jabber timer issues the flag TW2DONEC on TPH2 after 2 16+1 TCLKS (≈6.55 ms) of continuous transmission. This flag remains active for a jabber wait period of 96 TCLKs. In the preferred embodiment, the previous 96 TCLK jabber wait period (2 16+1−96 TCLKs) reduces jabber_length timings subsequent to a jabber_wait period in a consecutive jabber sequence to simplify implementation. The IMRSM 300 provides a transmit enable (TXENT) for all ports excluding the expansion port and an informational flag to issue a jam pattern (GENJAMT) to the BEHAVCNT 324. During a transmission of data, the STATUS 304 modifies the TXENT signal to disable a receiving port and ports failing link test. GENJAMT is a function of the receive and transmit collision signals sent from the EXPPORT 302 and the STATUS 304, including certain FIFO and transfer length conditions.

The STATUS 304 is responsive to GENJAMT, TXENT and RXCOLT from the IMRSM 300. The STATUS 304 provides a signal indicating that it detected a multiple collision (MLTICOLX), or it detected one AUI port or twisted pair MAU port in collision (ONECOLX), as well as that it received carrier sense (CSX). Assertion of MLTICOLX implies that multiple ports are active on a single IMR 50 (not including the expansion port) and corresponds to a transmit collision. Assertion of CSX indicates that preamble generation should commence. Assertion of ONECOLX corresponds to a receive collision as it implies that there is a collision only the AUI port in the absence of a transmission or that a single AUI or MAU port remains active during a jam sequence.

The DATABUF 320 receives TXENT, GENJAMT, a flag directing initiation of preamble generation (GENPRET), and a flag directing transmission of data (GENDATAT) from the IMRSM 300. GENDATAT is a function of a start of frame delimiter, a FIFO high-water mark flag and a preamble length count. The IMRSM 300 receives a start data out request (STDOUTX), an indication that the FIFO has reached the empty state normally (DATDONEX), a request to abort preamble generation (ABRTPREX), and a request to abort the current data packet (ABRTDATX) from the DATABUF 320. Data reaching the high-water mark in the FIFO asserts ABRTPREX. FIFO underflow or overflow asserts ABRTDATX. The DATABUF 320 provides the preamble, data, or jam pattern to be transmitted by the appropriate IMR expansion, AUI, or twisted-pair port at an output TXDOUTX. The IMRSM 300 uses TXDOUTX to identify whether DATABUF 320 issued an even or odd number of preamble bits at any particular time.

The RXBCKEND 322 receives GENJAMT from the IMRSM 300 to abort phase locked loop lock on activity during a collision. The AUIPORT 308 directly receives a signal used to prematurely end (½ bit time) a jam sequence of greater than 96 bits in order to satisfy IEEE 802.3 Standard cessation of jam requirements.

Figure 21:
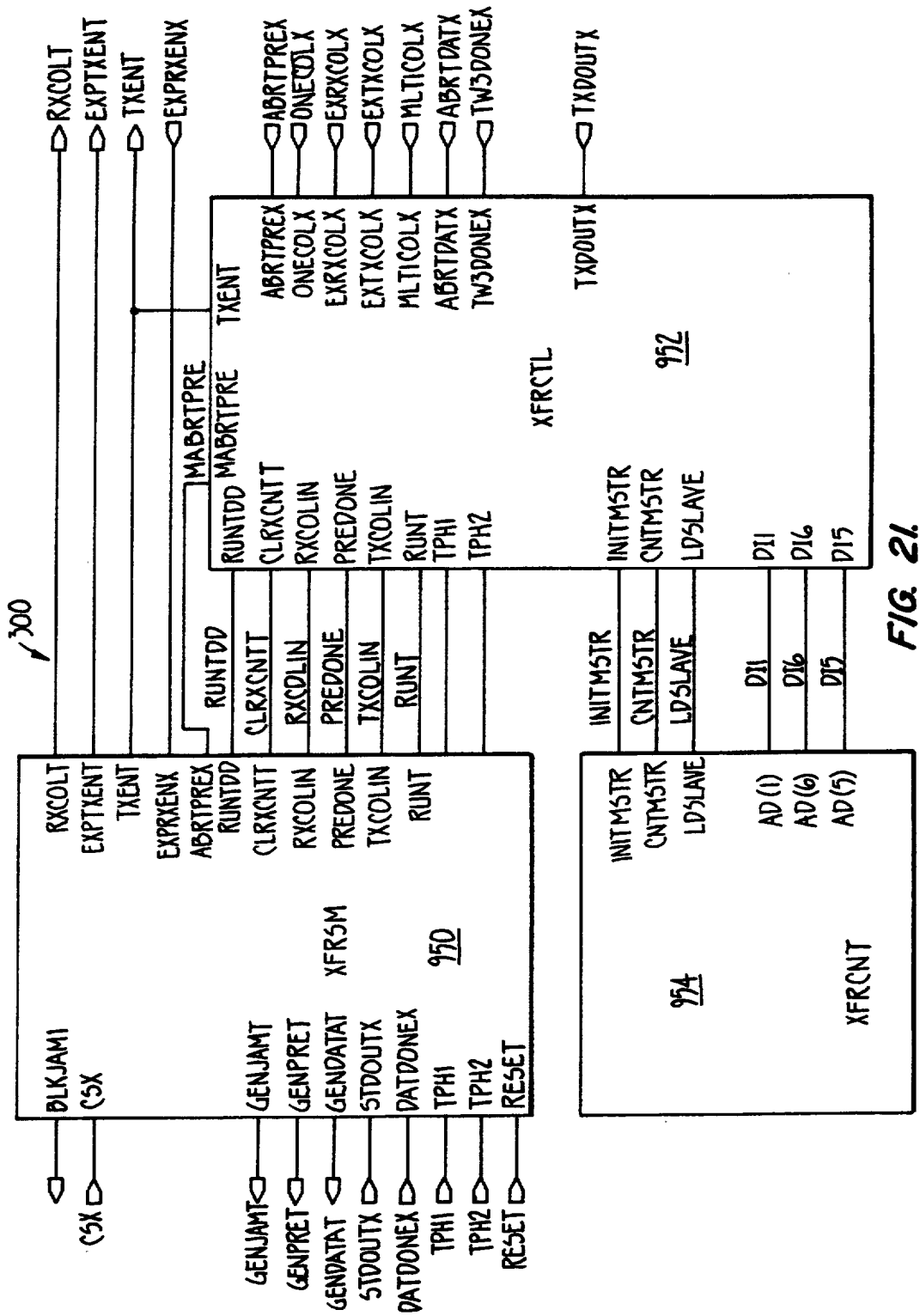

FIG. 21 is a block diagram of the IMRSM 300 comprising a transfer state machine (XFRSM) 950, a transfer control (XFRCTL) 952, and a transfer counter (XFRCNT) 954. The XFRSM 950 roughly corresponds to the IEEE 802.3 Standard state diagram as discussed above, and the XFRCTL 952 and the XFRCNT 954 operate as the single physical transfer timer. The transfer counter counts 96 bits to establish minimum JAM pattern transmission. Also, after transmission of at 62 bits, times out preamble generation. The XFRSM 950 receives CSX, STDOUTX, the transfer counter DATDONEX, TPH1, TPH2, RESET, and EXPRXENX, and drives BLKJAMT, GENJAMT, GENPRET, GENDATAT, RXCOLT, EXPTXENT, and TXENT. The XFRCTL 952 receives ABRTPREX, ONECOLX, EXRXCOLX, EXTXCOLX, MLTICOLX, ABRTDATX, TW3DONEX, and TXDOUTX from the blocks in FIG. 20 indicated above, as well as receiving TXENT from the XFRSM 950. The XFRSM 950 and the XFRCTL 952 exchange a plurality of signals. One of these signals establishes when the AUIPORT should cease jamming ½ bit time ahead of the other ports to satisfy the IEEE 802.3 Standard (RUNTDD). RUNTDD is a delayed function of RUNT using clocking delays developed from TPH1 and TPH2 to delay RUNT by one clock cycle. Other signals are: clear transfer counter (CLRXCNTT), ORing of all receive collisions across repeater unit 52, receive collision in (RXCOLIN), preamble done indicating 62 bits transmitted (PREDONE), ORing of all transmit collisions across repeater unit 52, transmit collision in (TXCOLIN), abort preamble developed from a FIFO high-wafer mark (ABRTPREX), and a RUNT packet indication (RUNT), as well as providing TPH1 and TPH2. The XFRCTL 902 and the XFRCNT 904 exchange three control signals; initialize master register to desired initial count (INITMSTR), increment master register by one (CNTMSTR), and local intermediate (slave) register (LDSLAVE), and three data signals, DI1, DI5, and DI6. Each clock cycle the state machine makes only one transition.

Figure 22A:
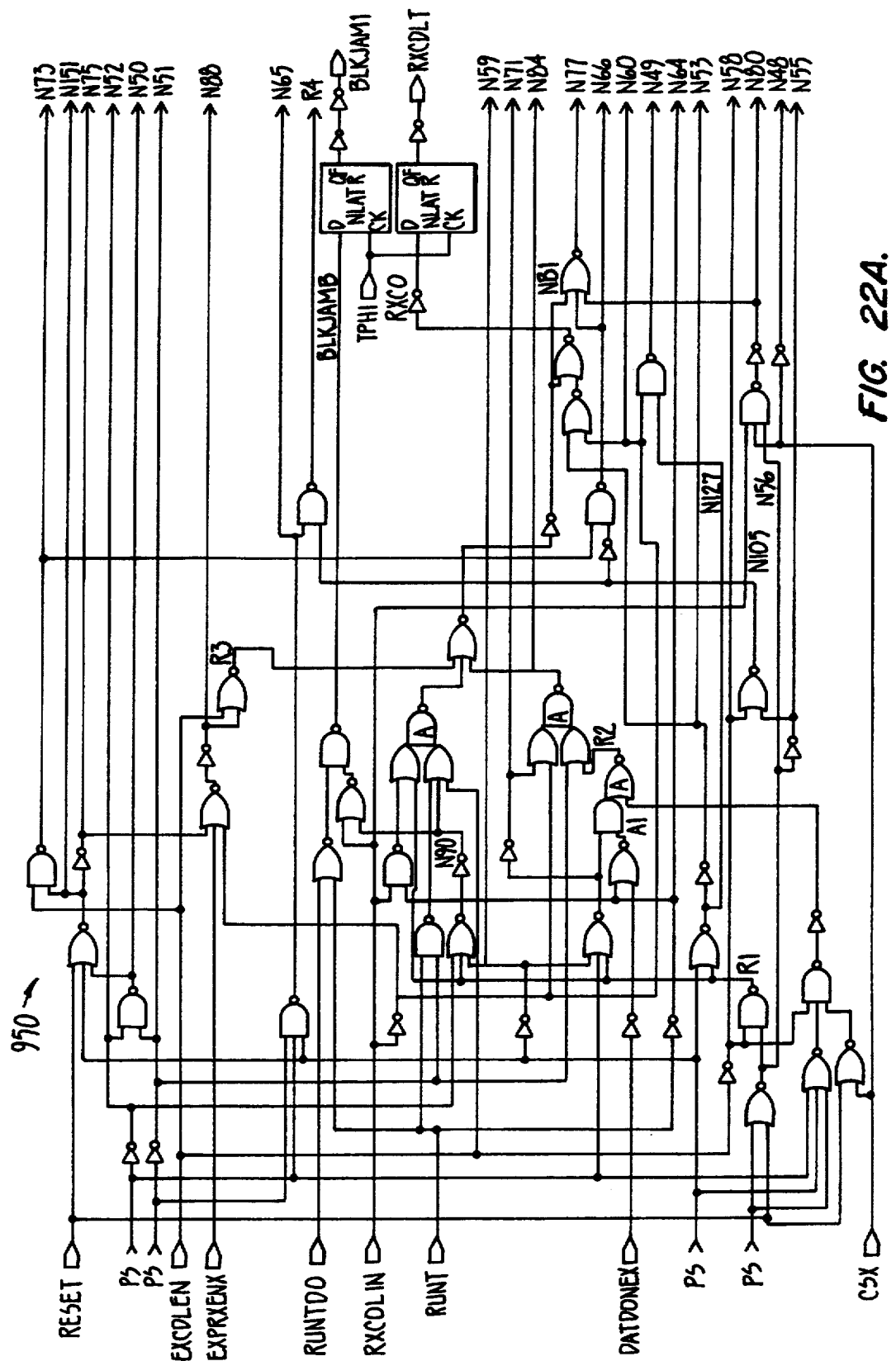
FIG. 22A and FIGS. 22B$_1$, and 22B$_2$ are schematic diagrams of XFRSM 950 of FIG. 21.
Figure 22B:
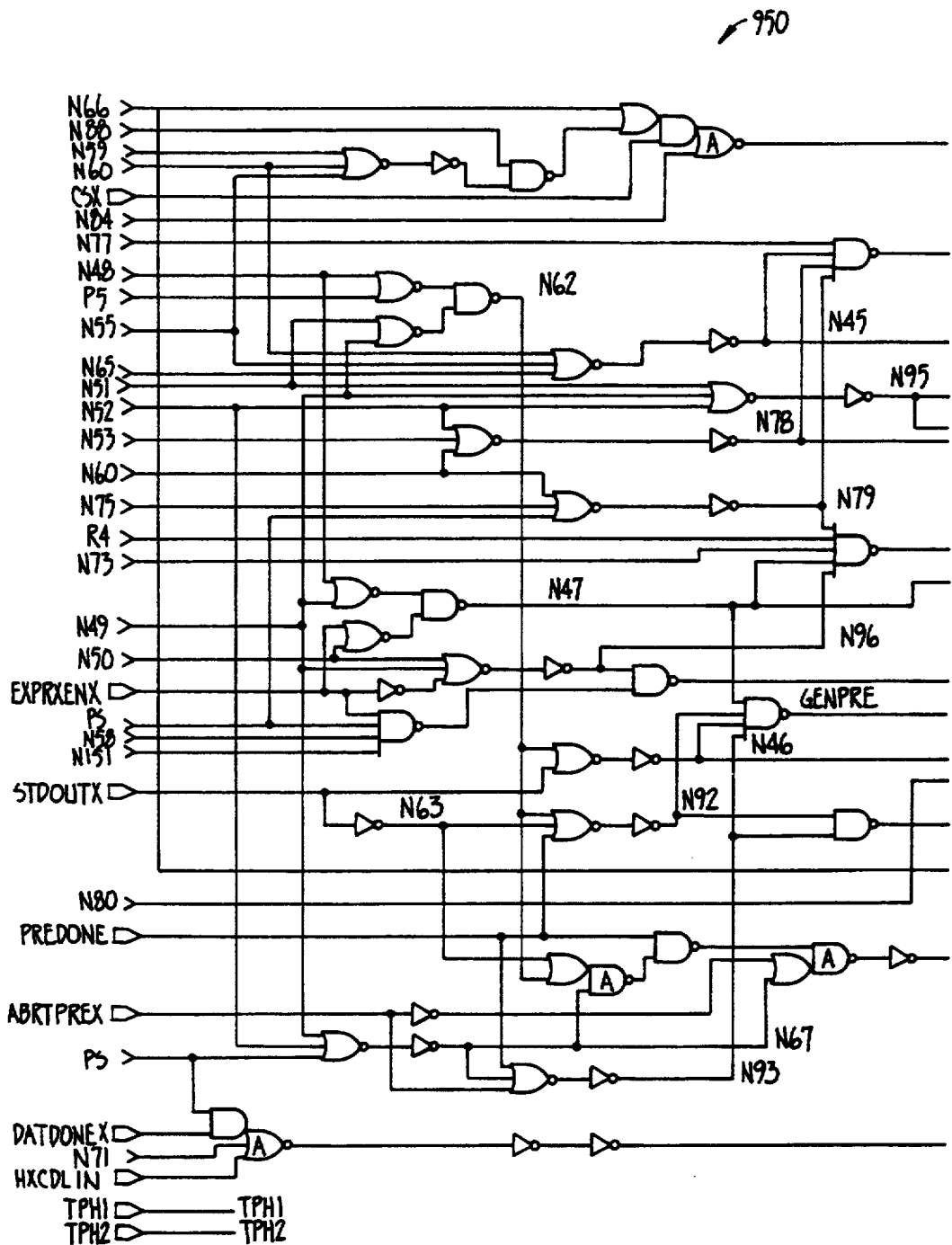

FIG. 22A and FIG. 22B is a schematic diagram of XFRSM 950 of FIG. 20. Both FIG. 22A and FIG. 22B comprise the XFRSM 950, with signals from the two FIGS connected as indicated by the labeled nodes, Nxx and PSx. Functionally, the XFRSM 950 performs the functions, transition and tests of state machine flow diagram of FIG. 18.

Figure 23:
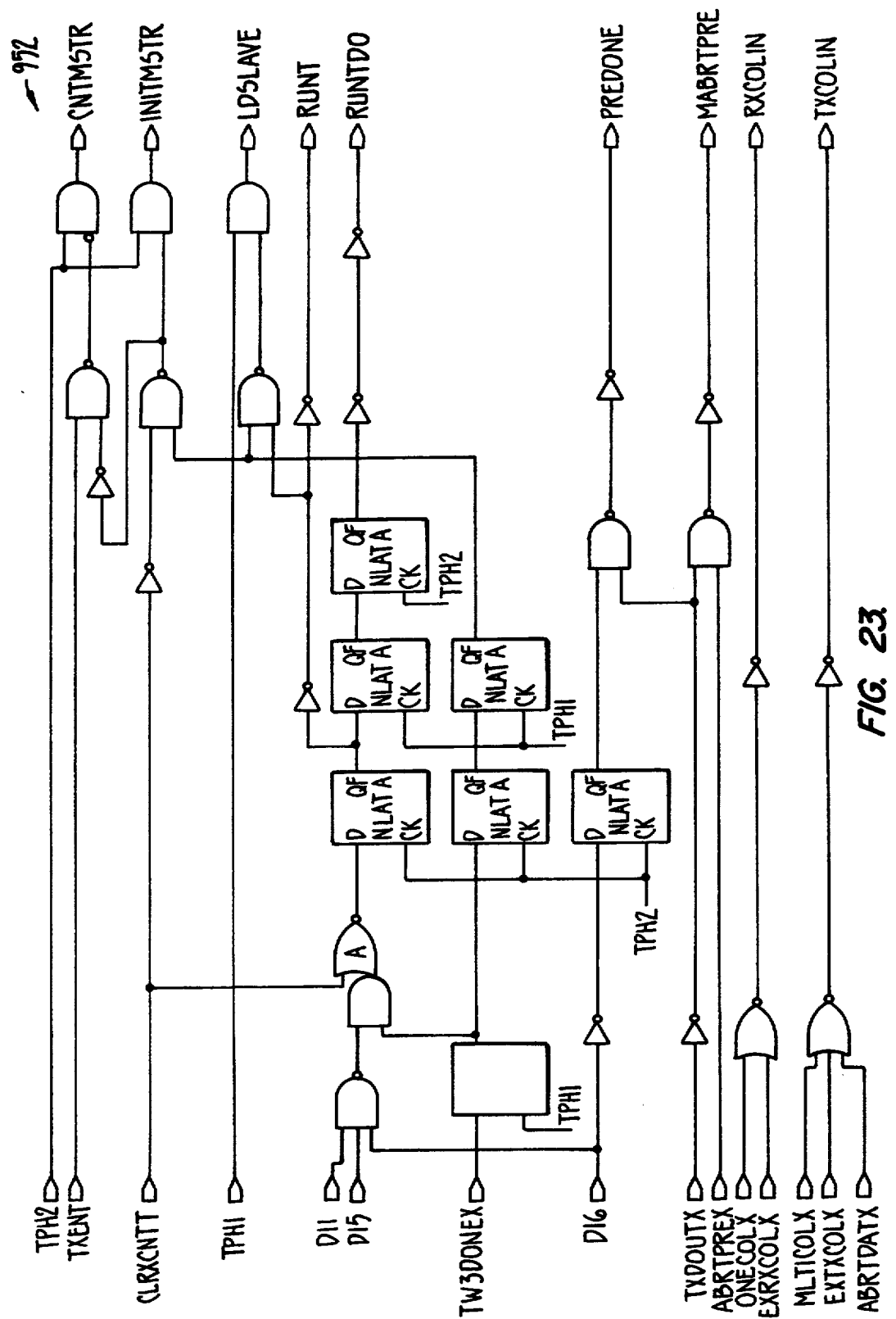

FIG. 23 is a schematic diagram of XFRCTL 952. Assertion of any of MLTICOLX, EXTXCOLX, or ABRTDATX asserts TXCOLIN. Assertion of either ONECOLX or EXRXCOLX asserts RXCOLIN. Assertion of ABRTPREX and negation of TXDOUTX asserts master preamble abort (MABRTPRE) which is ABRTPREX for the XFRSM 950. Transmissions, until 96 bits have been transmitted without a clear signal, asserts CNTMSTR. Assertion of CLRXCNTT asserts INITMSTR. Transmissions, until 96 bits have been transmitted, asserts LDSLAVE. Transmissions, until 96 bits have been transmitted, asserts RUNT. The transfer counter exceeding in indication that 62 bits have been transmitted, asserts PREDONE.

Figure 24:
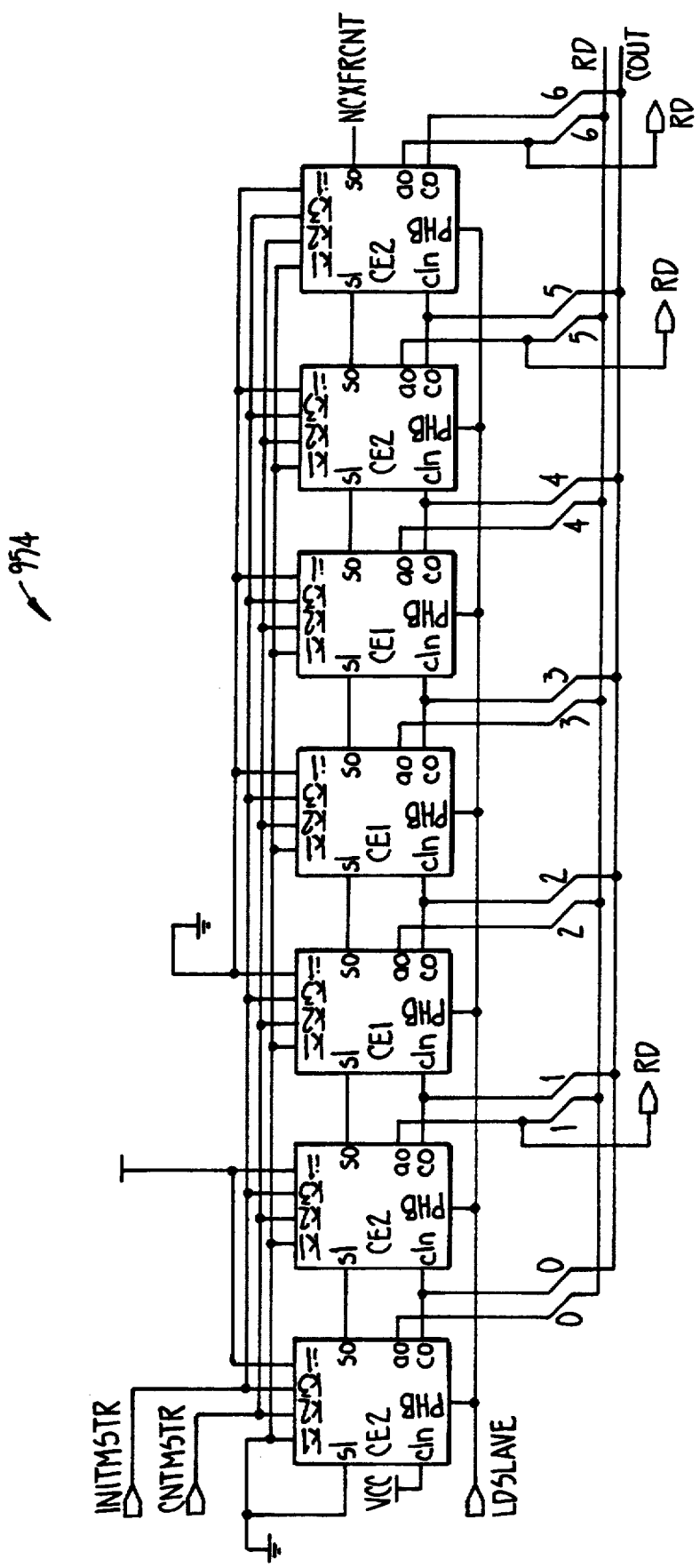

FIG. 24 is a block diagram illustrating operation of the XFRCNT 954. XFRCNT 904 is an initializable synchronous counter which can increment once per clock cycle.

Figure 8:
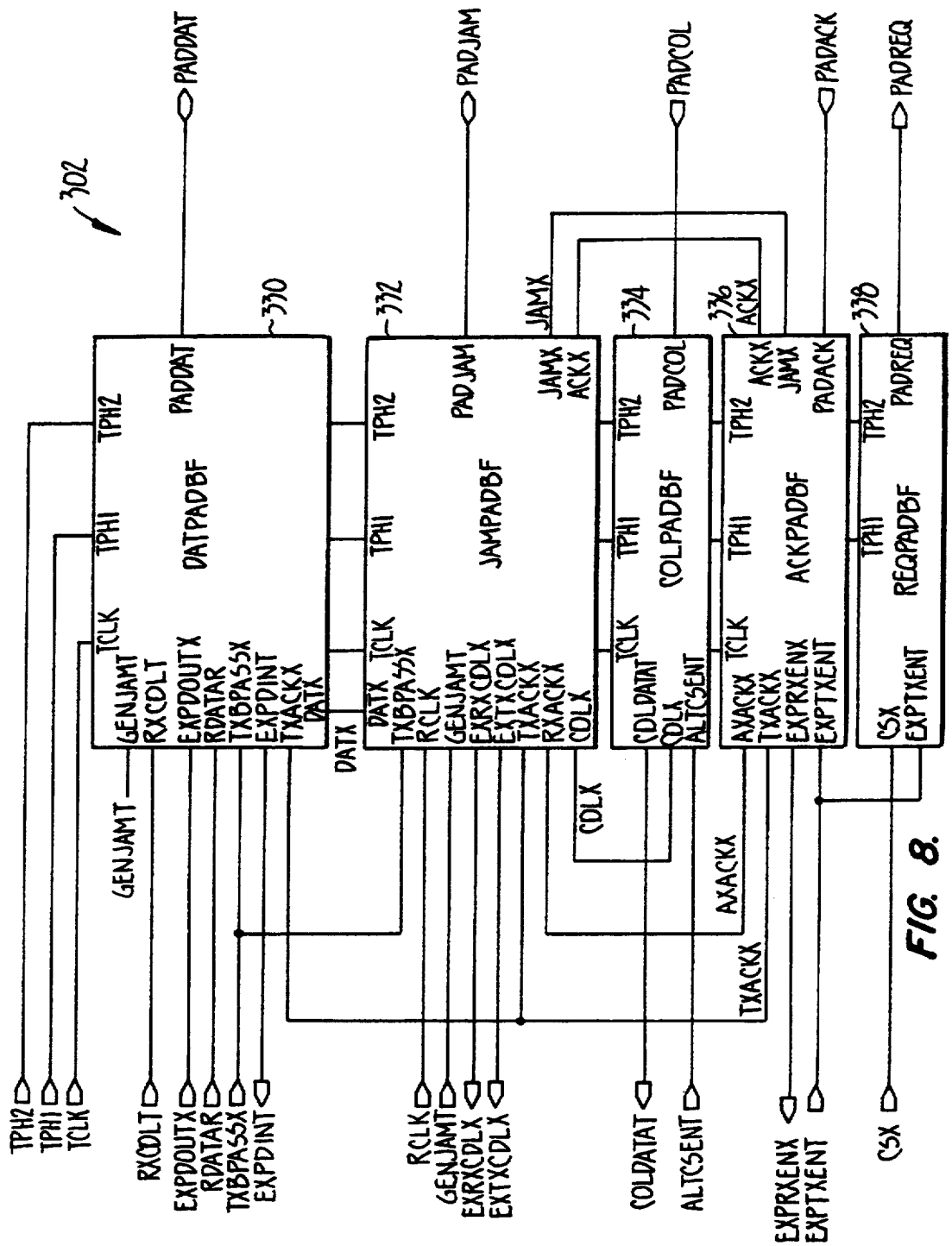
FIG. 8 is a schematic block diagram of EXPPORT 302 according to a preferred embodiment of the present invention.

FIG. 8 is a schematic block diagram of EXPPORT 302 according to a preferred embodiment of the present invention. A DATA pad buffer (DATPADBF) 330, a JAM pad buffer (JAMPADBF) 332, a COLLISION pad buffer (COLPADBF) 334, an ACKNOWLEDGE pad buffer (ACKPADBF) 336, and a REQUEST pad buffer (REQPADBF) 338 make up the EXPPORT 302. The respective functions operate to drive pads or receive signals from respective pads. The buffers 330 through 338 are responsive to specified signals as identified below. These signals, in addition to the pad signals, include the clock signals TCLK, TPH1 and TPH2.

Figure 25:
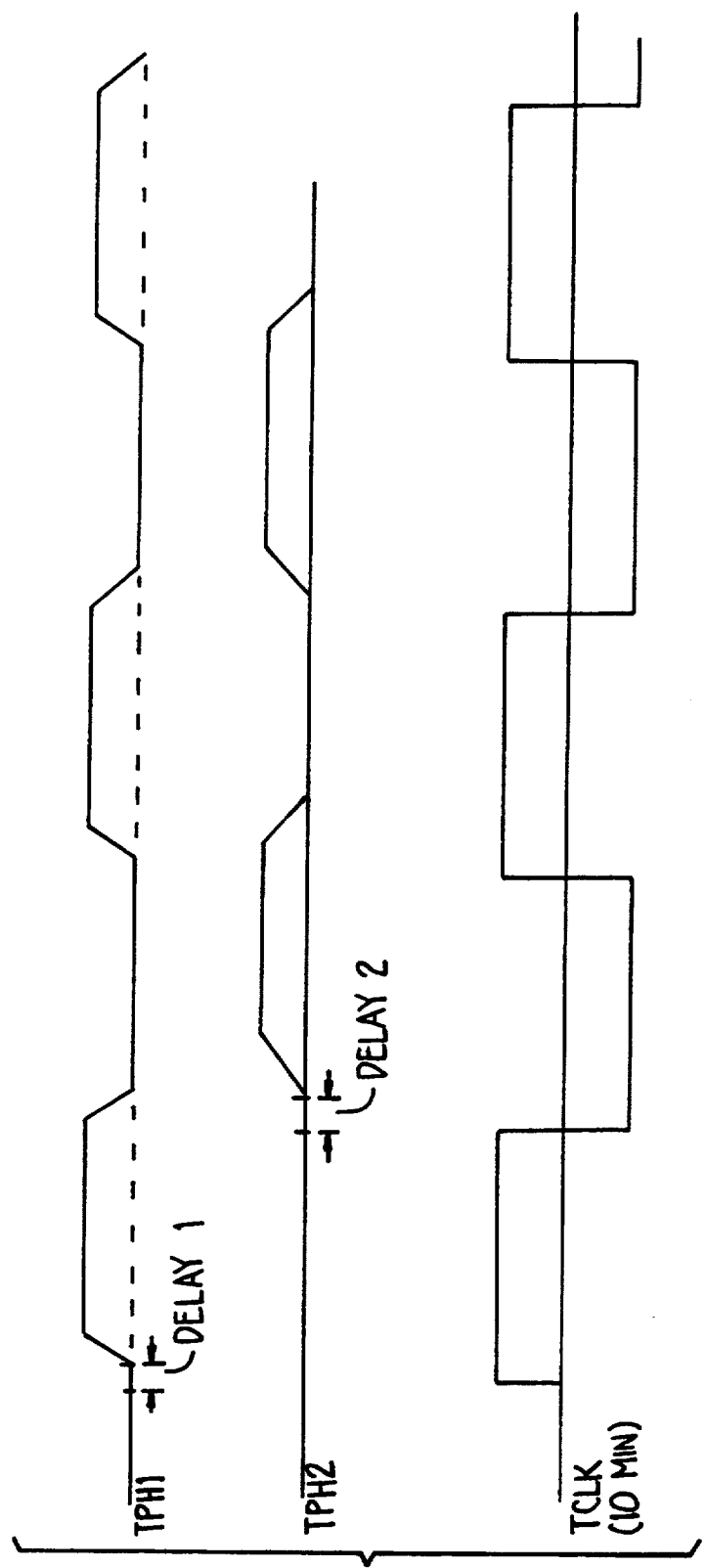
FIG. 25 illustrates the relationship between TCLK, TPH1 and TPH2.

FIG. 25 illustrates the relationship between TCLK, TPH1 and TPH2. TPH2 corresponds to negations of TCLK plus a first delay. TPH1 corresponds to assertions of TCLK plus a second delay. The first and second delays are chosen to provide data hold for IMRs which are destinations across the expansion bus. Other input signals include GENJAMT, RXCOLT, EXPDOUTX, receive data (RDATAR), transmit bypass (TXBPASSX), decoded receive clock from the phase lock loop (RCLK), alternate carrier sense enable (test feature) (ALTCSENT), EXPTXENT, and CSX. The EXPPORT 302 provides output signals, including expansion port received data in NRZ format (EXPDINT), EXRXCOLX, EXTXCOLX, test mode data received from PADCOL (COLDATAT) and EXPRXENX. The functional blocks of the EXPPORT 302 exchange signals with each other, which in addition to the TCLK, TPH1 and TPH2 signals, include: sampled state of DAT (DATX), sampled state of COL (COLX), sample state of JAM (JAMX), sampled state of ACK (ACKX), transmit acknowledge (TXACKX), and receive acknowledge (realize an IMR transmitting on expansion bus, so initiate receive procedure RXACKX). EXPTXENT controls which data is issued by an IMR 50. Concurrent assertion of EXPTXENT with an IMR state machine request to generate data (GENDATAT) results in issuance of FIFO data. Negation of EXPTXENT with GENDATAT asserted issues expansion port data. The reader will note that data from a sourcing IMR is simultaneously transmitted to the expansion ports and its other AUI and twisted-pair MAU ports. As a result, data packets will issue from the sourcing IMR two TCLKs earlier than for an expansion port destination IMR. This latency is also true for PADJAM signalling jam pattern generation.

Figure 9:
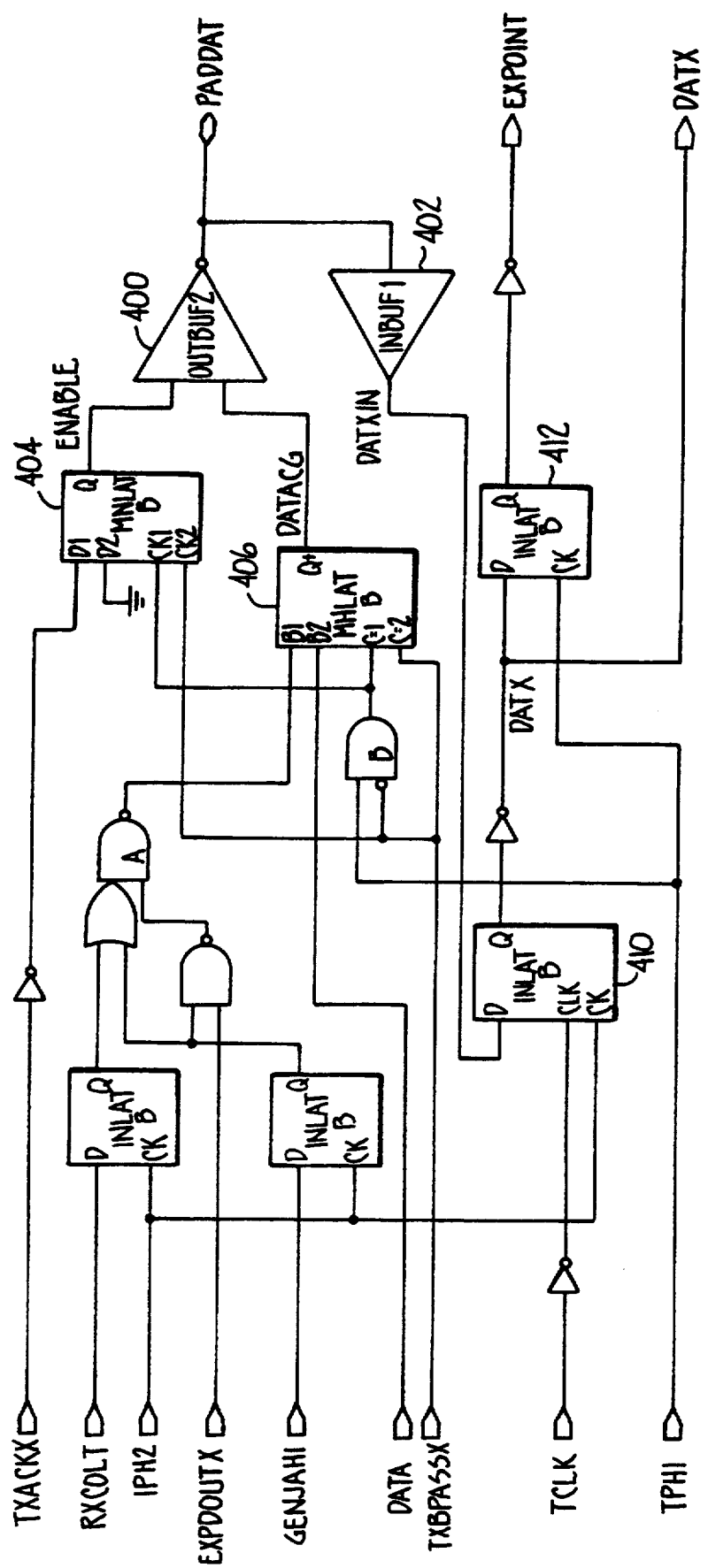
FIG. 9 is a circuit diagram of DATPADBF 330.

FIG. 9 is a circuit diagram of DATPADBF 330. An inverting output buffer 400 drives an output pad for DAT (PADDAT). An input buffer (NBUF) 402 buffers input signals from PADDAT. An MNLAT 404 enables or disables the buffer 400 in response to an inverted TXACKX signal, or an assertion of TXBPASSX. An output of an MNLAT 404 enables or disables operation of the buffer 400, with assertion of the output of the MNLAT 404 enabling the buffer 400.

The MNLAT 404 is a multiplexed NLAT, hence its name "MNLAT". An NLAT is a transparent latch in which an assertion of a clock signal allows an input signal to pass to a data output. The NLAT inverts the input signal to provide an inverted input signal as its output. The NLAT is a transparent latch in that assertion of the clock permits the output of the NLAT to change with a changing input signal without successive assertions of the clock signal. The MNLAT has two data inputs and two clock inputs. Each data input is associated with one of the clock inputs such that assertion of a first clock input operates to "latch" a signal at the first input. Similarly, assertion of a second clock "latches" the second input signal.

Some IMR to IMR variation occurs in the clock signals TCLK, TPH1 and TPH2. For certain operations, a TNLAT helps to retime the various signals communicated between IMRs via the expansion bus. A TNLAT has a single data input and dual clock inputs. Asserting both clocks results in operation of the TNLAT.

An MNLAT 406 controls the data of the output buffer 400. A logical product of TPH1 and an inverted TXBPASSX along with TXBPASSX, provide the clocking signals for MNLAT 404. Assertion of TPH1 and negation of TXBPASSX asserts clock1 of both the MNLAT 404 and the MNLAT 406. Testing the IMR is simplified by providing for TXBPASSX, but is not an important part of the preferred embodiment of the present invention. RDATAR appears at PADDAT upon assertion of TXBPASSX in the test mode. Due to inversion by MNLAT404, assertion TPH1 and negation of TXBPASSX with assertion of TXACKX enabler buffer 400.

A combinatorial logic function of RXCOLT, GENJAMT and EXPDOUTX produce data for PADDAT, except for assertions of TXBPASSX as described above. The logic function combines to assert PADDAT upon assertion of TXACKX and either a) assertion of TXDOUTX and negation of GENJAMX, or b) assertion of both GENJAMX and RXCOLX. TXDOUTX entering the EXPPORT 302 becomes EXPDOUTX. GENJAMX and RXCOLX correspond to GENJAMT and RXCOLT as follows: each signal is a one-half clock delayed version of the respective signal.

Concurrent assertion of both TPH2 and an inverted TCLK send signals from PADDAT through a TNLAT 410. Subsequent assertion of TPH1 sends these signals through an NLAT 412 to an invertor. An output of the inverter provides EXPDINT. Sampling of an inverted output of TNLAT 410 (twice inverted PADDAT) provides DATX, a time advanced EXPDINT.

Figure 10:
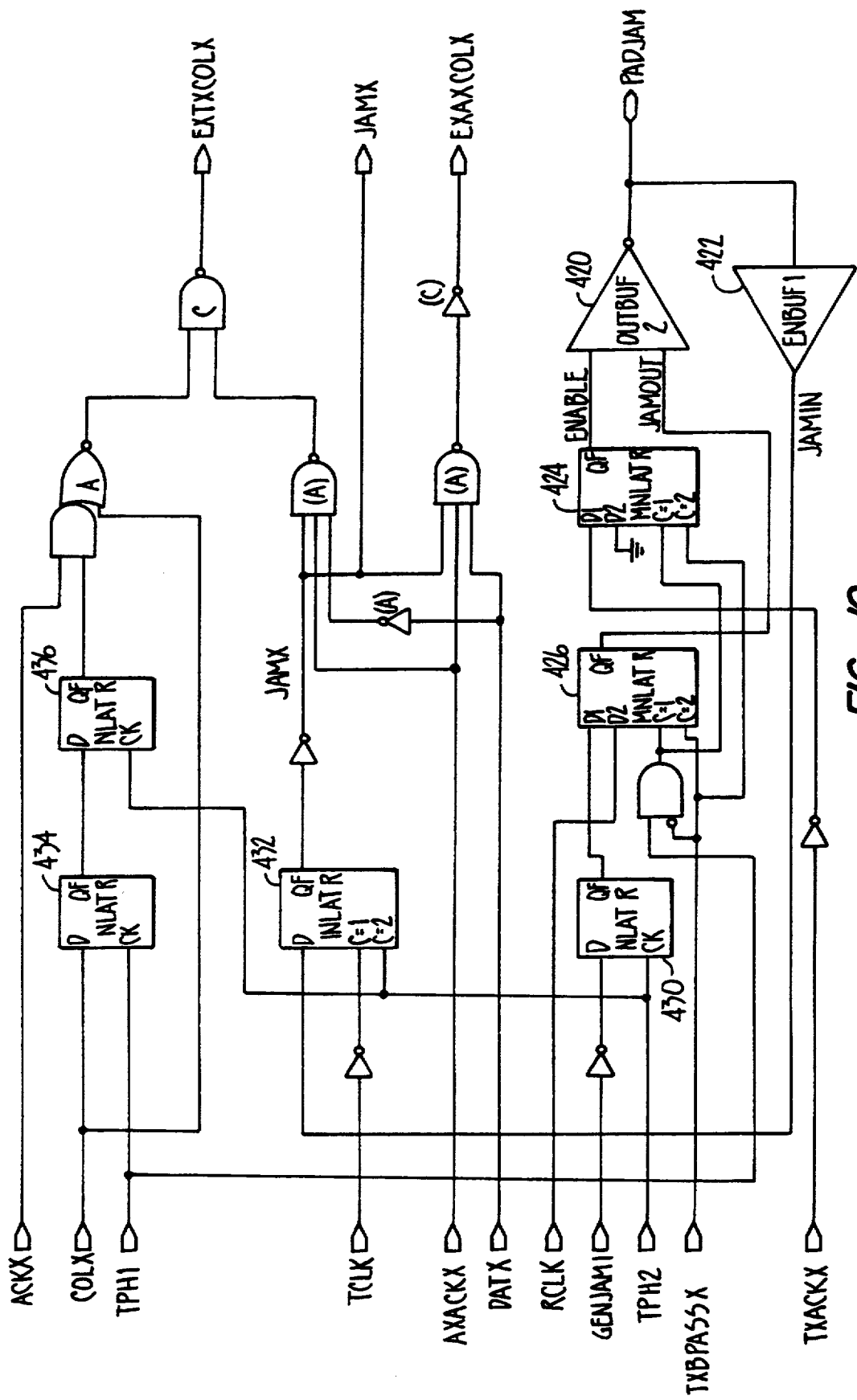
FIG. 10 is a circuit diagram of JAMPADBF 332.

FIG. 10 is a circuit diagram of JAMPADBF 332. The JAM pad (PADJAM), receives either an input or an output signal. An inverting output buffer 420 drives PADJAM for the output mode and an input buffer 422 receives input signals from PADJAM for the input mode. An asserted output from an MNLAT 424 enables the buffer 420. Output from the MNLAT 426 provides data for the buffer 420. For enabling the buffer 420, entering the test mode, that is asserting TXBPASS, enables the buffer 420, the second input of MNLAT 424 tied low, and provides an inverted RCLK to the output of MNLAT 426.

For other than the test mode, assertion of TPH1 and negation of TXBPASSX latches an inverted output of an NLAT 430 to the output of MNLAT 426 and latches a twice inverted TXACKX to the output of the MNLAT 424. Assertion of TPH2 latches a twice inverted GENJAMT to the output of the NLAT 430. Therefore, assertion of TXACKX and assertion of GENJAMT without the test mode asserts PADJAM after successive TPH2 and TPH1 clocks.

Concurrent assertion of an inverted TCLK and TPH2 latches inverted PADJAM input data to an output of a TNLAT 432. An inverted output of the TNLAT 432 (twice inverted and clock delayed PADJAM input) is JAMX. Assertion of ACKX, COLX, and a COLX from a previous cycle latched through an NLAT 434 and an NLAT 436 by successive TPH1 and TPH2 asserts EXTXCOLX. The pair of NLATs, NLAT 434 and NLAT 436 ensure that the transition from multiple IMRs involved in a collision to one IRM involved in a collision occurs smoothly due to a one clock bus acquisition delay. Bus acquisition delay results, for example, from the one clock delay in an IMR of a repeater unit having a collision when multiple IRM have previously been involved in a collision. The arbiter indicates multiple IMR collisions. The individual IMR experiencing a collision informs the other IMRs via the DAT and JAM signals. There is a one cycle delay for such a transition from multiple collisions to single IMR collision. Also, assertion of JAMX and RXACKX, and negation of DATX asserts EXTXCOLX. Assertion of JAMX, RXACKX, and DATX asserts EXRXCOLX.

Figure 11:
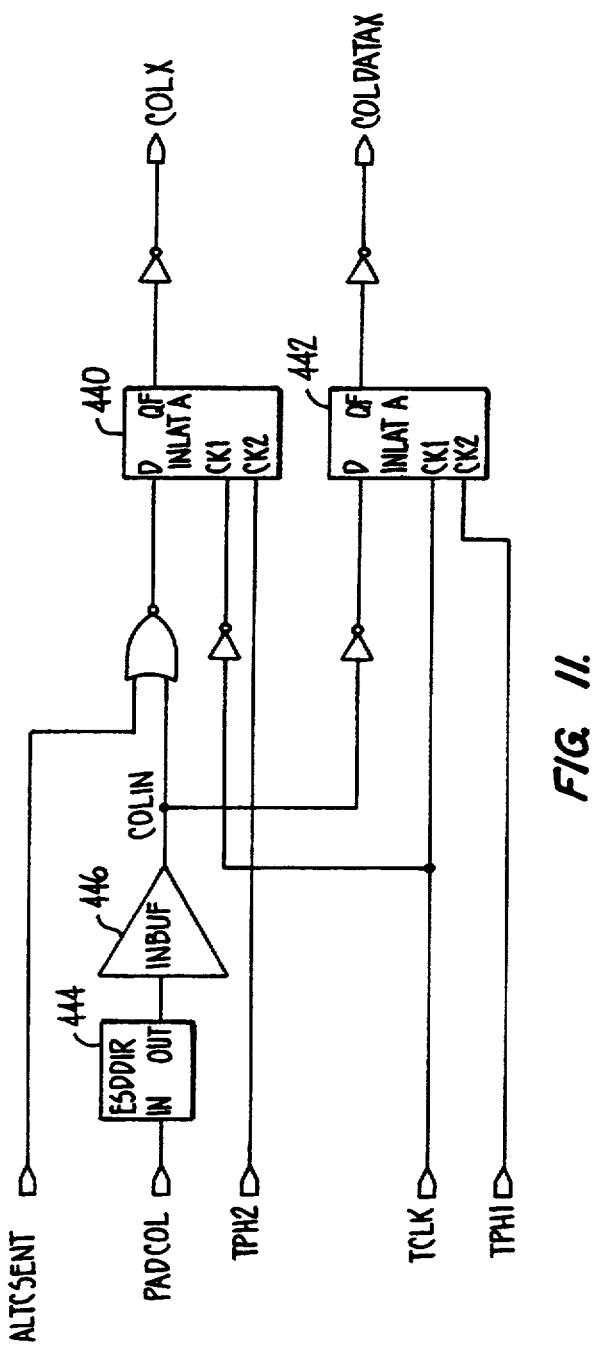
FIG. 11 is a schematic circuit diagram of COLPADBG

FIG. 11 is a schematic circuit diagram of COLPADBF 334. COLPADBF 334 receives an input signal (PADCOL) from the COLLISION pin (active low in the preferred embodiment) and generates COLX and COLDATAT. Concurrent assertion of TCLK and TPH2 to a TNLAT 440 asserts COLX upon assertion of PADCOL (low) or negation of ALTCSENT. Concurrent assertion of TCLK and TPH1 to a TNLAT 442 asserts COLDATAT upon assertion of PADCOL (low). An electrostatic discharge protection device, ESDDIA 444 and an input buffer 446 buffer PADCOL.

Figure 12:
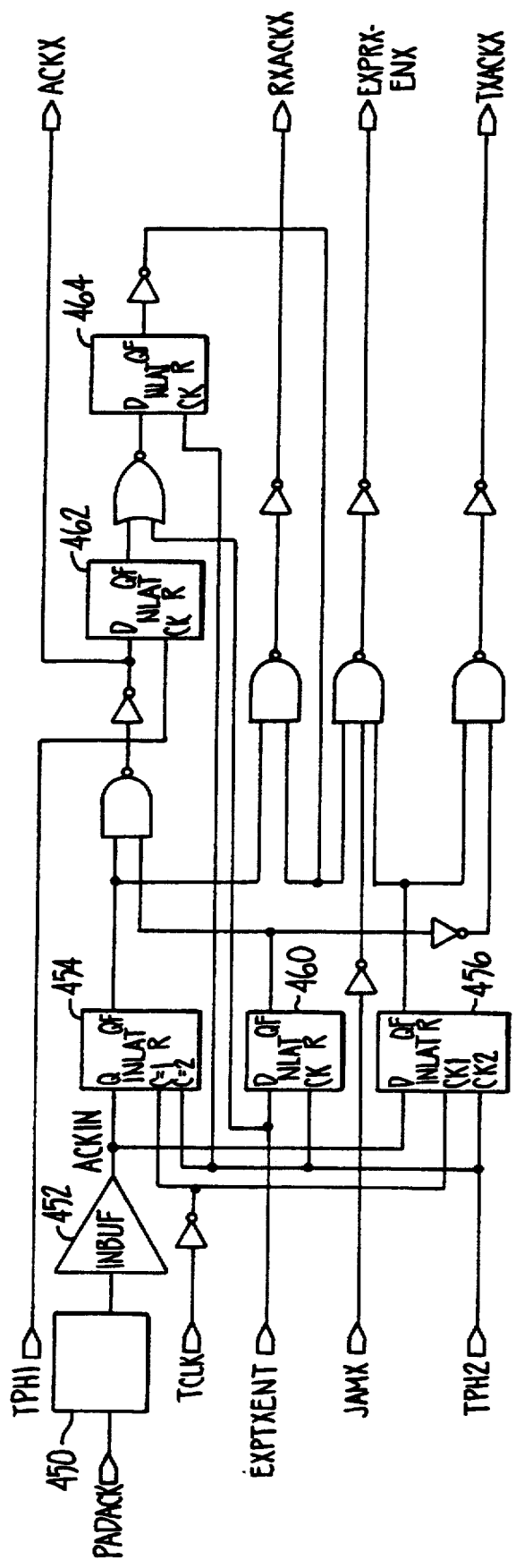
FIG. 12 is a schematic circuit diagram of ACKPADBF

FIG. 12 is a schematic circuit diagram of ACKPADBF 336. ACKPADBF 336 receives an input signal (PADACK) from the ACKNOWLEDGE pin (active low) of the IMR 50 and generates ACKX, RXACKX, EXPRXENX, and TXACK from PADACK, EXPTXENT, and JAMX. An ESDDIA 450 and an input buffer 452 buffer PADACK to provide ACKIN. Assertion of an inverted TCLK and TPH2 to a TNLAT 454 and to a TNLAT 456 latches an inverted ACKIN to an output of the TNLAT 454 and the TNLAT 456. Assertion of TPH2 to an NLAT 460 latches an inverted EXPTXENT to its output. Concurrent assertion of the output of the TNLAT 454 and of the output of the NLAT 460 asserts ACKX. Assertion of TPH1 to an NLAT 462 latches an inverted ACKX to its output. Assertion of TPH2 to an NLAT 464 latches an inverted logical sum of the inverted ACKX 62, the prior cycle ACKX (for a bus acquisition delay), and current EXPTXENT to an output. Concurrent assertion of an inverted output of the NLAT 464 and the output of the TNLAT 454, and an inverted current ACKIN from TNLAT 454, asserts RXACKX. Concurrent assertion of the inverted output of the NLAT 464 and the output of the TNLAT 456, as well as concurrent negation of JAMX asserts EXPRXENX. Assertion of the output of the TNLAT 456 and negation of the output of the NLAT 460 asserts TXACKX.

Figure 13:
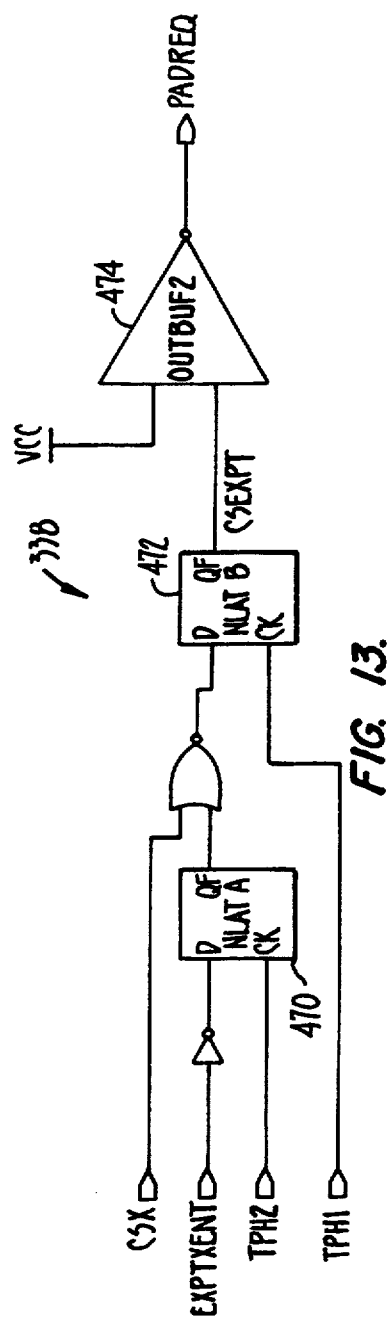
FIG. 13 is a schematic circuit diagram of REQPADBF

FIG. 13 is a schematic circuit diagram of REQPADBF 338. REQPADBF 338 drives an output signal (PADREQ) (active low) from the REQUEST pin of the IMR 50 in response to CSX and EXPTXENT. Assertion of TPH2 to an NLAT 470 latches a twice inverted EXPTXENT to its output. Assertion of TPH1 to an NLAT 472 latches a logical sum of CSX and the output of the NLAT 470 to its output. An inverting output buffer 474 receives the output of the NLAT 472 and inverts it to drive PADREQ.

FIG. 14 is a schematic block diagram of the STATUS 304 of FIG. 7. The STATUS 304 operates in relation to the signals from the IMRSM 300 to particularize the IMR for the number and type of ports. As noted above, the IMRSM 300 is unaware of the particular type of ports and their number which it controls. The STATUS 304 block monitors the activities of the individual ports to identify ports which are receiving, and which are transmitting, and the whether the JAM pattern or data is being transmitted. The STATUS 304 also modifies enabling signals directed to the ports to deselect particular ports, for example a port that has failed linktest, or to disable a transmit enable to a receiving port. The STATUS 304 comprises a MAU status circuit (MAUSTAT) 500 for each MAU port of the IMR 50 and an AUI status circuit (AUISTAT 502) for each AUI port. A status control (STATCTL) 504 supports operation of the MAUSTAT 500 circuits and the AUISTAT 502 circuit. The STATUS 304 receives TXENT, GENJAMT, ALTCSENT, TW3DONEX, RXCOLT, RESETT, TPH1, and TPH2, among other signals. The STATUS 304 produces a plurality of signals, including CSX, ONECOLX and MLTICOLX.

FIG. 15 is a schematic block diagram of an AUISTAT 502. The AUISTAT 502 includes an AUI carrier sense detector (AUICSDET) 510, a partition state machine (PARTSM) 512, a transmit recovery counter control (TXRECCTL) 514, a transmit recovery counter (TXRECCNT) 516, a collision count limit counter control (CCLIMCTL) 518 and a collision count limit counter (CCLIMCNT) 520. The AUICSDET 510 supplies three signals used in the IMRSM 300. These signals include ONECOLX, MULTICOLX and CSX. The PARTSM 512 performs equivalently to the IEEE 802.3 Standard partition state machine.

FIG. 16 is a schematic block diagram of an MAUSTAT 500 of FIG. 14. The MAUSTAT 500 comprises a MAU carrier sense detector (MAUCSDET) 550, a partition state machine (PARTSM) 552, a receive link state machine (RXLNKSM) 554, a receive link detector (RXLNKDET) 556, a CCLIMCTL 558 and a CCLIMCNT 560. The MAUSTAT serves to provide MAU carrier sense and collision information to AUISTAT 502 used in producing ONECOLX, MLTICOLX, and CSX.

FIG. 17 is a circuit diagram of the AUICSDET 510 of FIG. 15. More than one port involved in a collision asserts MLTICOLX. Receive collision from an AUI PORT without any other receive activity or one port remaining in multiport collision asserts ONECOLX. Receive activity on any enabled port asserts CSX.

FIG. 18 is a detailed IMRSM 500 flow chart outlining the functions of the state machine using the signal representations of FIG. 7 through FIG. 18, and FIGS. 20 through 24. In the flow chart of FIG. 18, rectangles represent one of eight states for a sourcing IMRs IMRSM 300. An example of a state is IDLE at step 600. An oval represents an output which asserts a particular value. An example of an output is assertion of EXPTXENT at step 626, for example. Diamonds represent decisions, or tests, to check a status of an identified value. An example of such a test step is step 604 which tests the value of TXCOLIN. If TXCOLIN is false, process flow continues to step 606. TXCOLIN true results in execution of step 850*h*. Step 850*h* is a branch to step 850. Circles represent these branch steps.

Step 620 through step 744 correspond to steps 210, 220 and 222 of FIG. 6. Values tested in certain of the diamond decision steps are outlined below the chart. Interpretation of the notation for the values include: "+" means "OR" or logical sum, "*" means "AND" or logical product, and "!" means "NEGATION" or invert. For example, assertion of PADDAT (PADDAT true) occurs upon assertion of both PADACK and EXPTXENT together with either negation of GENJAMX and assertion of TXDOUTX or assertion of both GENJAMX and RXCOLX.

Implementation of the IMRSM 300 from the flow chart of FIG. 18 as described above results in a distributed repeater function among one or more IMRs 50. The distribution of the repeater function permits creation of a repeater unit 52 from these IMRs 50 which act in concert as a single repeater, contributing only a single delay amount. A twisted pair medium network is able to incorporate up to four of the repeater units 52 in series and still conform to the 10Base-T standard and the IEEE 802.3 Standard. Each repeater unit 52 is able to have an specified number of ports, not limited by the particular number of ports provided on a single integrated circuit device. Combining additional chips permits addition of as many ports as are necessary to any given repeater unit 52.

Figure 19:
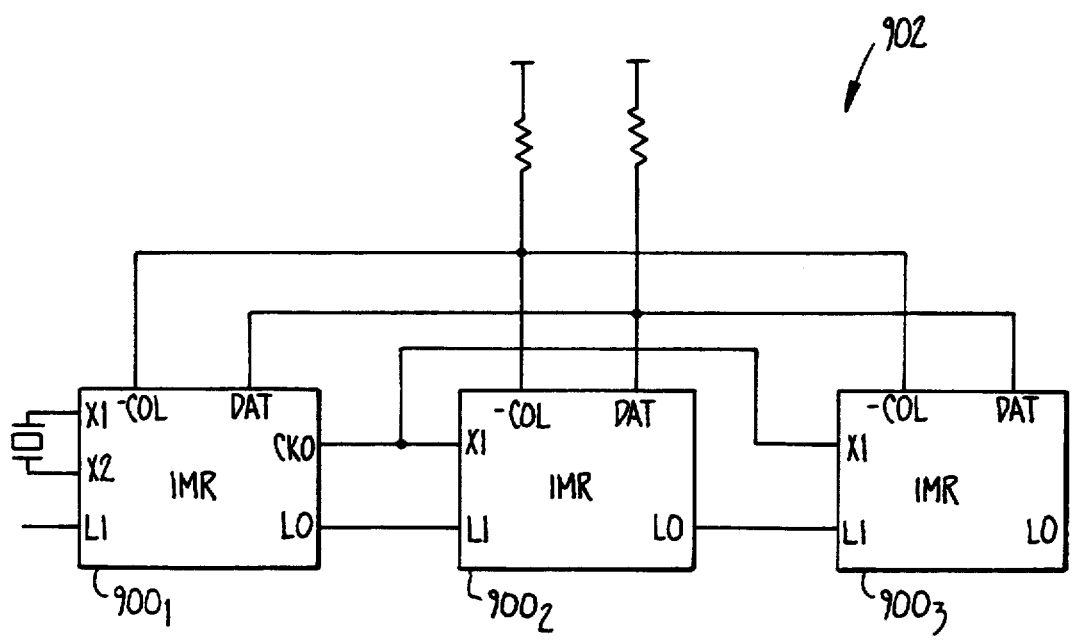
FIG. 19 is a schematic circuit diagram of an alternate preferred embodiment of the present invention.

FIG. 19 is a schematic circuit diagram of an alternate preferred embodiment of the present invention. This alternate preferred embodiment "daisy chains" a plurality of IMRs 900 in order to increase a number of ports available in a repeater unit 902. This configuration conforms to the required repeater functions of IEEE 802.3 Standard. The system incorporates an arbiter function with each chip, rather than provide an external arbiter function as provided in the preferred embodiment. It would be possible to enable such a daisy chain arbitration system to respond to an external arbiter as well. Each IMR 900 includes four signals permitting use of this expansion feature. These four signals include: link in (LI), link out (LO), data (DAT) and collision (COL). Cascade connecting the IMRs 900 as illustrated provides for limited expansion. DAT and −COL, the "−" indicating low level assertion (active low) of COL, are bi-directional signals. A particular IMR 900 outputs data included in a data packet following preamble regeneration and fragment extension on its DAT line. An IMR 900 sensing a collision, asserts COL, which signals the collision and initiates a collision jam sequence.

Link In (LI) and Link Out (LO) have a dual function. During reset, LI and LO establish a master IMR. During operation, LI and LO establish a mechanism to detect collisions across multiple IMRs 900. Resetting a particular IMR $900_1$ that is "highest" or first in a chain (LI is asserted) causes its LO to be negated. IMRs 900 set LO=LI, making the first IMR 900 a master IMR 900 because its LI is tied high. The IMR $900_1$ generates clock out (CKO) to synchronize an IMR $900_2$ and an IMR $900_3$.

During operation, LO is asserted if LI is asserted and all input ports are idle (no signal quality error (SQE)). If any of the input ports of a particular IMR 900 has any SQE (it is not idle) or LI is negated, LO will be negated. An IMR 900 having LI negated and a signal present on any input port will then assert COL. An internal collision for a particular IMR 900 also asserts COL. This mechanism permits correct operation of the repeater unit 902 when simultaneous data appears on input ports of separate IMRs 900. Assertion of LI and negation of LO of a particular IMR 900, results in that IMR having bus mastership to drive DAT.

An alternate preferred embodiment implemented by IMR 900 permits an increase in a number of ports for a repeater unit 900. The daisy chain implementation has a limit to the number of ports which may be added to a repeater unit 902, which is believed to be about three IMRs 900. Therefore, for networks not requiring as great an expansion capability as that offered by use of an IMR 50, IMR 900 will serve the desired purpose. Ripple delays limit IMR 900 performance.

In conclusion, the present invention efficiently, simply and economically permits the number ports of a repeater fashioned from discrete circuits to be increased while maintaining conformity with the IEEE 802.3 Standard. While the above is a complete description of the preferred embodiments of the present invention, various alternatives, changes and equivalents to these preferred embodiments are possible. For example, a repeater comprised of monolithic circuits implementing the relay (repeater) functions separately from the MAU, with the repeater circuits interconnected with the same expansion system. That is, the IMRs would be separate from the relay functions without integrating the relay and MAUs into a single chip. Also, other predetermined activities among selected ports can be equivalently implemented across multiple IMRs. Therefore, the above description does not limit the scope of the present invention. The appended claims define this scope and set forth metes and bounds of the invention.

What is claimed is:

1. A computer network including a plurality of repeaters, at least one of the plurality of repeaters comprising:
   a plurality of repeater circuits, each repeater circuit having a plurality of ports for receiving data at one port and transmitting said data to a number of other ports;
   means, coupled to said plurality of repeater circuits, for relaying said data from one of said plurality of repeater circuits to other of said plurality of repeater circuits for transmission of said data from said other repeater circuits' said number of other ports;
   identifying means, coupled to each of the plurality of repeater circuits, for identifying a predefined activity among said plurality of ports of said plurality of repeater circuits; and
   means, coupled to said identifying means, for coordinating synchronized concurrent processing of said predefined activity by said plurality of repeater circuits so that said plurality of repeater circuits function as a single repeater.

2. The computer network of claim 1 in which within said at least one repeater said predefined activity comprises a collision.

3. The computer network of claim 2 wherein each said repeater circuit includes means for processing said collision among its said plurality of ports.

4. The computer network of claim 3 in which said at least one repeater further comprises:
   means, coupled to said each processing means, for distributing said collision processing among said plurality of repeater circuits to have the repeater process said collision as a single unit.

5. The computer network of claim 1 wherein each said repeater circuit includes means for processing said predefined activity among its said plurality of ports.

6. The computer network of claim 5 in which said at least one repeater further comprises:
   means, coupled to each said processing means, for distributing said predefined activity processing among said plurality of repeater circuits to have the repeater process said predefined activity as a single unit.

7. The computer network of claim 1 wherein all of said plurality of ports include said predefined activity to be identified.

8. A computer network including a plurality of repeaters, at least one of the repeaters comprising:
   a first and a second repeater circuit each having a predetermined number of ports for receipt and transmission of data, each said repeater circuit implementing a sequence of steps to receive data at one port, repeat said data from a number of other ports, and means for processing collisions;
   an expansion port, coupled to said first and second repeater circuit, for relaying particular data received at a port of a particular repeater circuit to another repeater circuit; and
   an arbiter function, coupled to said expansion port of each said repeater circuit, for implementing a protocol causing said first and second repeater circuits to function as a single repeater by coordinating concurrent processing of data and collision information by said first and second repeater circuits.

9. A computer network including a plurality of repeaters, at least one repeater comprising:

a plurality of repeater circuits each having a predetermined number of ports for receipt and transmission of data and including a state machine function supporting a set of predefined repeater functions; and means, coupled to said plurality of repeater circuits, for coordinating implementation of each repeater's set of predefined repeater functions by synchronizing each said state machine function to implement said set of predefined repeater functions for a combination of said plurality of repeater circuits to operate said combination of said plurality of repeater circuits as a single repeater implementing said set of predefined repeater functions.

10. The computer network of claim 9 wherein said plurality of repeater circuits comprises more than three repeater circuits.

11. The computer network of claim 9 wherein all of said plurality of repeater circuits are coordinated.

12. A computer network including a plurality of repeaters, at least one of the plurality of repeaters, comprising:

a plurality of repeater circuits, each having a predetermined number of ports for receipt and transmission of data and including a state machine for implementing a set of predefined repeater functions including processing of collisions among its ports, each said repeater circuit comprising:

means for asserting an output signal when one of its ports has received a data group;

means for providing said data group to a first bidirectional channel in response to assertion of a first input signal if said repeater circuit has asserted said output signal, otherwise said repeater circuit transmitting from its ports data provided on said first bidirectional channel in response to assertion of said first input signal;

means for detecting a first collision type or a second collision type and initiating an appropriate collision processing sequence, said repeater circuit asserting a signal on a second bidirectional channel in response to concurrent assertion of said output signal and said first input signal, said repeater circuit additionally asserting a signal on said first bidirectional line if said collision is of said first collision type and deasserting said signal on said first bidirectional line if said collision is of said second collision type;

means for responding to an assertion of said first input signal and a concurrent assertion of said signal on said second bidirectional channel to initiate collision processing for said first collision type if said signal on said first bidirectional channel has been asserted, otherwise initiating second collision type processing if said signal on said first bidirectional channel has been deasserted;

means for initiating collision processing upon assertion of a second input signal;

an arbiter function, coupled to said plurality of repeater circuits, for asserting said first input signal to all repeater circuits if only one output signal is asserted, otherwise said arbiter function asserting said second input signal; and an expansion bus, providing said output signals of each repeater circuit to said arbiter function, providing said first input signal from said arbiter function to all said repeater circuits in parallel, providing said second input signal from said arbiter function to all said repeater circuits in parallel, said expansion bus intercoupling said first bidirectional channels of said plurality of repeater circuits to each another in parallel and intercoupling said second bidirectional channels of said plurality of repeater circuits to each other in parallel.

13. A computer network which includes an expansion method for a repeater circuit having a limited port number with an expansion capability, the method comprising the steps of:

providing the first repeater circuit in a discrete chip having a preestablished number of ports, said repeater circuit including an expansion bus for conveying a status of state machine functions to other repeater circuits coupled on said expansion bus;

coupling a second repeater circuit also having a preestablished number of ports and an expansion port to said expansion port of the repeater circuit; and synchronizing said state machine functions of said second repeater circuit and the first repeater circuit using said expansion bus to provide a single repeater from said repeater circuits.

* * * * *